US009835670B2

(12) United States Patent
Nagase

(10) Patent No.: US 9,835,670 B2
(45) Date of Patent: Dec. 5, 2017

(54) ISOLATOR, SEMICONDUCTOR DEVICE, AND METHOD FOR CONTROLLING ISOLATOR

(71) Applicant: Renesas Electronics Corporation, Kawasaki-shi, Kanagawa (JP)

(72) Inventor: Hirokazu Nagase, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/167,022

(22) Filed: May 27, 2016

(65) Prior Publication Data

US 2016/0274170 A1 Sep. 22, 2016

Related U.S. Application Data

(63) Continuation of application No. 14/745,837, filed on Jun. 22, 2015, now Pat. No. 9,395,402.

(30) Foreign Application Priority Data

Jul. 2, 2014 (JP) .................................. 2014-136464

(51) Int. Cl.
*G01R 31/00* (2006.01)
*G01R 31/02* (2006.01)
(Continued)

(52) U.S. Cl.
CPC ....... *G01R 31/025* (2013.01); *G01R 31/1263* (2013.01); *H03K 17/687* (2013.01)

(58) Field of Classification Search
CPC ..................................................... H02M 5/10
See application file for complete search history.

(56) References Cited

U.S. PATENT DOCUMENTS 6,208,531 B1 3/2001 Vinciarelli et al.
8,358,129 B2 1/2013 Imai et al.
(Continued)

FOREIGN PATENT DOCUMENTS

JP 2002-222477 A 8/2002
JP 2010-48746 A 3/2010
JP 2010-130325 A 6/2010

OTHER PUBLICATIONS

Masayuki Hikita, et al., "New Approach to Breakdown Study by Measuring Pre-Breakdown Current in Insulating Materials", Japanese Journal of Applied Physics (JJAP), Dec. 1984, pp. L886-L888, vol. 23, No. 12.

*Primary Examiner* — Jeffrey Zweizig
(74) *Attorney, Agent, or Firm* — Sughrue Mion, PLLC

(57) ABSTRACT

An isolator includes: a transmission circuit that generates an alternating current transmission signal in which a first potential is set to be a reference potential; a first insulating element to which the alternating current transmission signal is supplied; a second insulating element that generates an alternating current reception signal in which a second potential is set to be a reference potential by being alternating current-coupled to the first insulating element through an insulating film; a reception circuit that reproduces reception data based on the alternating current reception signal; an impedance control unit that controls an impedance of the first or the second insulating element to be higher than an impedance before the control; and a leakage current detection unit that detects a leakage current flowing between the first and the second insulating elements through the first or the second insulating element in which the impedance has been controlled.

13 Claims, 20 Drawing Sheets

(51) Int. Cl.
  *G01R 31/12* (2006.01)
  *H03K 17/687* (2006.01)

(56) References Cited

U.S. PATENT DOCUMENTS 9,030,856 B2 * 5/2015 Kamata .................... H02H 3/33
                                                   324/127
2013/0043880 A1   2/2013 Bettenwort et al.

* cited by examiner

ISOLATOR, SEMICONDUCTOR DEVICE, AND METHOD FOR CONTROLLING ISOLATOR

CROSS-REFERENCE TO RELATED APPLICATIONS

This application is a continuation application of U.S. patent application Ser. No. 14/745,837, filed on Jun. 22, 2015, which is based upon and claims the benefit of priority from Japanese patent application No. 2014-136464, filed on Jul. 2, 2014, the disclosure of which is incorporated herein in its entirety by reference.

BACKGROUND

The present invention relates to an isolator, a semiconductor device, and a method for controlling the isolator and, for example, can be suitably utilized for an isolator including first and second insulating elements, a semiconductor device, and a method for controlling the isolator.

In a case where a signal is transmitted between circuits having largely different power supply voltages, when the signal is directly transmitted by a wiring, breakage of the circuits and failure of signal transmission may occur due to a voltage difference generated in a direct-current voltage component of the signal to be transmitted. Therefore, utilization of an isolator as a circuit that transmits a signal while insulating circuits having different power supply voltages from each other has spread.

An isolator utilizing a photo coupler has been known as a related isolator, and in recent years, research on an isolator utilizing insulating elements, such as a coil (a transformer) and a capacitor, has been advanced. The isolator utilizing the insulating elements connects semiconductor chips having different power supply voltages to each other by the insulating elements through an insulating film, and transmits only an alternating-current signal by alternating-current-coupling (AC-coupling) the insulating elements to each other.

Note that as related technologies, Japanese Unexamined Patent Application Publications No. 2010-48746, No. 2002-222477, and No. 2010-130325, and Masayuki Hikita et al., "New Approach to Breakdown Study by Measuring Pre-Breakdown Current in Insulating Materials", Japanese Journal of Applied Physics (JJAP), vol. 23, No. 12, December, 1984, pp. L886-L888, have been known.

SUMMARY

In recent years, isolators have begun to be utilized for various applications (application systems). Further, since utilization of isolators for applications, such as an in-vehicle system, has rapidly increased, improvement in reliability of the isolators has been strongly desired.

However, in the related art, reliability has not been sufficiently considered in the isolator utilizing the insulating elements. For example, when a breakdown occurs in the insulating film between the insulating elements, an excessive short-circuit current flows so as to possibly lead to malfunction or destruction of peripheral circuits. Since it is impossible to prevent a breakdown at the time of actual use beforehand in the related isolator, a system cannot be safely utilized.

As described above, the related isolator has a problem that it is difficult to improve reliability.

Other problems of the conventional art and a new feature of the present invention will be apparent from the description of the specification and accompanying drawings.

According to one embodiment, an isolator includes: a transmission circuit; a first insulating element; a second insulating element; a reception circuit; an impedance control unit; and a leakage current detection unit.

The transmission circuit generates an alternating-current transmission signal in which a first potential is set to be a reference potential based on input transmission data. The generated alternating-current transmission signal is supplied to the first insulating element. The second insulating element is alternating-current-coupled to the first insulating element through an insulating film, and thereby generates an alternating-current reception signal in which a second potential different from the first potential is set to be a reference potential according to the alternating-current transmission signal. The reception circuit reproduces reception data based on the generated alternating-current reception signal. The impedance control unit controls an impedance of the first or the second insulating element to be higher than an impedance before the control. The leakage current detection unit detects a leakage current that flows between the first and the second insulating elements through the first or the second insulating element in which the impedance has been controlled.

According to the one embodiment, reliability of the isolator can be improved.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Premise Example of Embodiments

Figure 16:
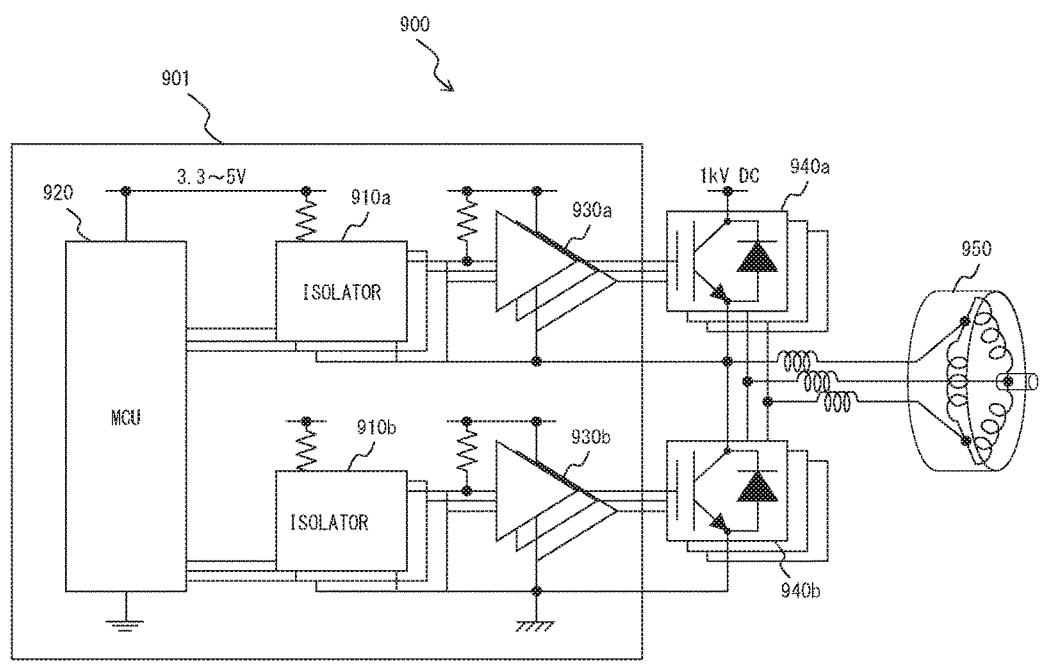
FIG. 16 is a configuration diagram showing a configuration of a motor control system in accordance with a premise example of the embodiments.

Before embodiments are explained, a premise example before the embodiments are applied will be explained. FIG. 16 shows a configuration of a motor control system in accordance with the premise example of the embodiments.

As shown in FIG. 16, a motor control system 900 includes: a plurality of isolators 910a and 910b (either of them is also referred to as an isolator 910); an MCU 920; a plurality of gate drivers 930a and 930b (either of them is also referred to as a gate driver 930); a plurality of IGBTs 940a and 940b (either of them is also referred to as an IGBT 940); and a motor 950. For example, the MCU 920, the plurality of isolators 910a and 910b, and the plurality of gate drivers 930a and 930b are mounted on the one-package semiconductor device 901.

The motor 950 is a three-phase motor having U-phase, V-phase, and W-phase coils. The IGBT 940a, which is a high-side motor driver, and the IGBT 940b, which is a low-side motor driver, are connected for each phase of the U phase, the V phase, and the W phase. The isolators 910a and 910b are connected to the high side and the low side of each phase of the IGBTs 940a and 940b, and the motor 950, respectively through the gate drivers 930a and 930b.

The MCU 920 is connected to the isolators 910a and 910b, transmits a control signal to the IGBTs 940a and 940b through the isolators 910a and 910b, and the gate drivers 930a and 930b, and alternately switches the IGBTs 940a and 940b. The high-side IGBT 940a makes a current flow to the motor 950, the low-side IGBT 940b extracts the current from the motor 950, and thereby the motor 950 is rotationally driven.

As shown in FIG. 16, a power supply voltages of the MCU 920 side is 3.3 to 5 V, and a power supply voltage of a side of the IGBT 940 and the motor 950 is 1 kV. Accordingly, since reference potentials (corresponding to GND) of the MCU 920 side and the side of the IGBT 940 and the motor 950 have a difference of approximately several hundreds to several kilovolts due to a difference in the power supply voltages, the control signal cannot be directly transmitted. Therefore, the isolator 910 that insulates circuits having different potentials from each other in a DC manner is made to intermediate in order to transmit a drive signal from the MCU 920 to the motor 950. Since inductors or capacitors are used for insulating elements of the isolator 910, and the insulating elements transmit and receive a signal by AC coupling through an insulating film, a difference in reference potentials between transmission and reception circuits can be absorbed.

Figure 17:
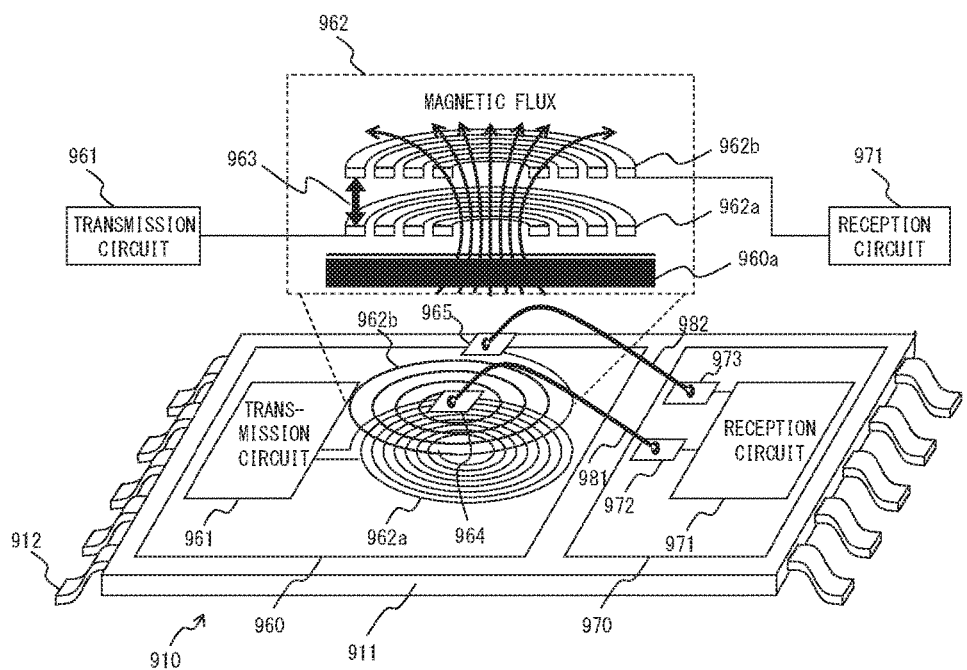
FIG. 17 is a perspective diagram schematically showing a mounting example of an isolator in accordance with the premise example of the embodiments.

FIG. 17 schematically shows a mounting structure of the isolator 910 in accordance with the premise example. As shown in FIG. 17, in the isolator 910 included in the semiconductor device 901, a transmission-side chip 960 and a reception-side chip 970 are mounted on a mounting substrate 911 including an external terminal 912.

In the transmission-side chip 960, a transmission circuit 961; a transmission-side coil (a primary-side coil) 962a and a reception-side coil (a secondary-side coil) 962b that are included in an on-chip transformer 962; and pads 964 and 965 connected to the reception-side coil 962b are formed. In the reception-side chip 970, a reception circuit 971; and pads 972 and 973 connected to the reception circuit 971 are formed.

The pads 964 and 972 are connected to each other through a bonding wire 981, and the pads 965 and 973 are connected to each other through a bonding wire 982. Namely, the reception circuit 971 and the reception-side coil 962b are connected to each other through the pad 972, the bonding wire 981, and the pad 964, and are also connected to each other through the pad 973, the bonding wire 982, and the pad 965.

In the on-chip transformer 962, the transmission-side coil 962a and the reception-side coil 962b are formed in first and second wiring layers in a semiconductor chip, respectively, and an interlayer insulating film (also simply referred to as an insulating film) 963 is formed between the transmission-side coil 962a and the reception-side coil 962b.

As described above, in the isolator 910, the transmission-side coil 962a and the reception-side coil 962b are AC-coupled to each other through the interlayer insulating film 963, and thereby the signal is transmitted and received. For this reason, the difference in the reference potentials of the transmission-side circuit and the reception-side circuit, which reaches several kilovolts, is applied to the interlayer insulating film 963 between the insulating elements, and thus there is a problem that the insulating film deteriorates along with use of the isolator.

Figure 18:
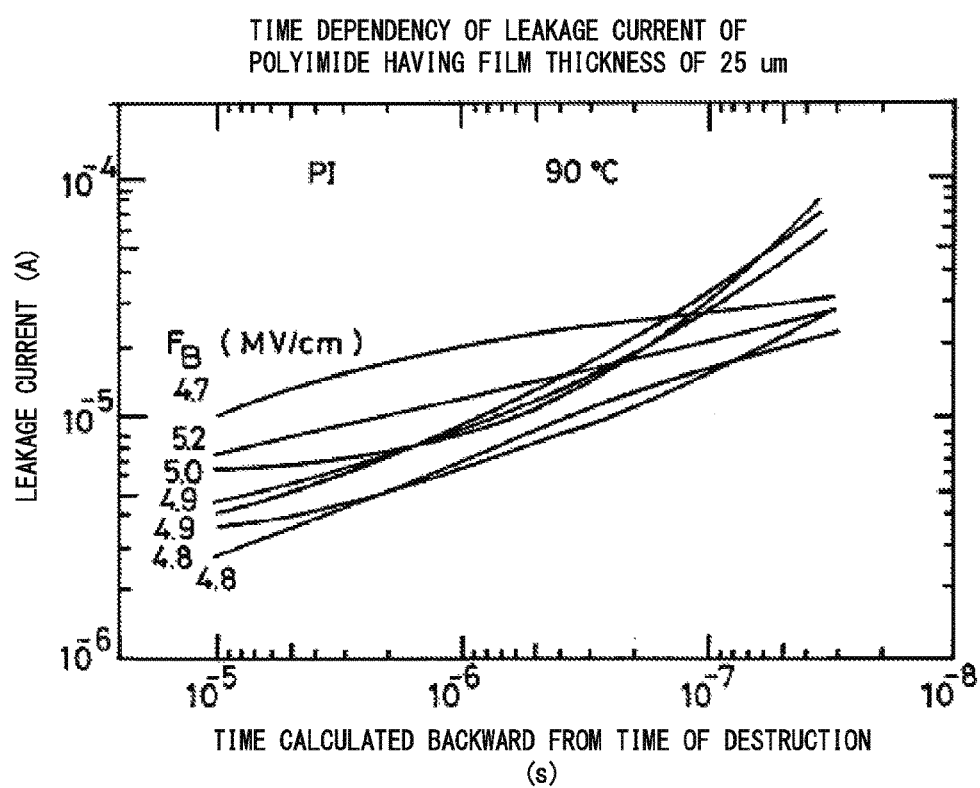
FIG. 18 is a graph showing a relation between a leakage current and destruction of an insulating film that is described in Masayuki Hikita et al., "New Approach to Breakdown Study by Measuring Pre-Breakdown Current in Insulating Materials", Japanese Journal of Applied Physics (JJAP), vol. 23, No. 12, December, 1984, pp. L886-L888.

A graph of FIG. 18 is a result of a measurement of a leakage current that flows through an insulating film described in Masayuki Hikita et al., "New Approach to Breakdown Study by Measuring Pre-Breakdown Current in Insulating Materials", Japanese Journal of Applied Physics (JJAP), vol. 23, No. 12, December, 1984, pp. L886-L888. In FIG. 18, a time elapsed until a breakdown and a leakage current at the time the breakdown are observed in the insulating film formed of polyimide having a film thickness of 25 um.

In FIG. 18, an applied voltage is monotonously increased at 30 V/s, and it can be regarded to be substantially constant in a time range of the graph. Although an absolute value of the applied voltage is unknown, it is at least not less than 3000 V since an observation time is not less than 100 s. Since a withstand voltage of polyimide having the 25 um thickness is 5000 to 6000 V, the insulating film is expected to be in a comparatively high-stress state.

An experimental result of FIG. 18 shows that a phenomenon in which the leakage current increases in accordance with a time elapse under a substantially constant voltage of 10 us to 10 ns before the breakdown occurs, and suggests that the increase in the leakage current and the breakdown (progress of insulation deterioration) are related to each other.

As described above, the insulating property of the insulating film decreases as a result of long-term use etc. even if a rated voltage operation is performed. In that case, a short circuit occurs between the transmission-side circuit and the reception-side circuit of the isolator, to thereby cause a failure of peripheral equipment. In motor control for automobiles, securement of reliability is particularly emphasized since a serious accident might arise if it is not secured.

A Note that although it can also be considered to include a fuse in a motor control system in order to prevent the above-described malfunction and failure due to a short circuit, a function to safely stop the system at the time of the breakdown has not been achieved. In addition, measures against the breakdown in an isolator level are not taken.

Consequently, in the embodiments explained hereinafter, a state of the isolator just before it becomes a breakdown state is detected utilizing a fact that there is a relation between increase in the leakage current and the breakdown. Namely, in the embodiments, a leakage current detection function to detect the leakage current of the insulating film in the isolator and control means thereof are provided. According to the embodiments, the leakage current that increases due to deterioration of the insulating film can be detected before occurrence of chip destruction, and operation of the system can be safely stopped. For example, since current rise continues for several microseconds before the breakdown in the example of FIG. 18, an increase in the current can be detected during the current rise, to thereby safely control the system.

Embodiment 1

Figure 1:
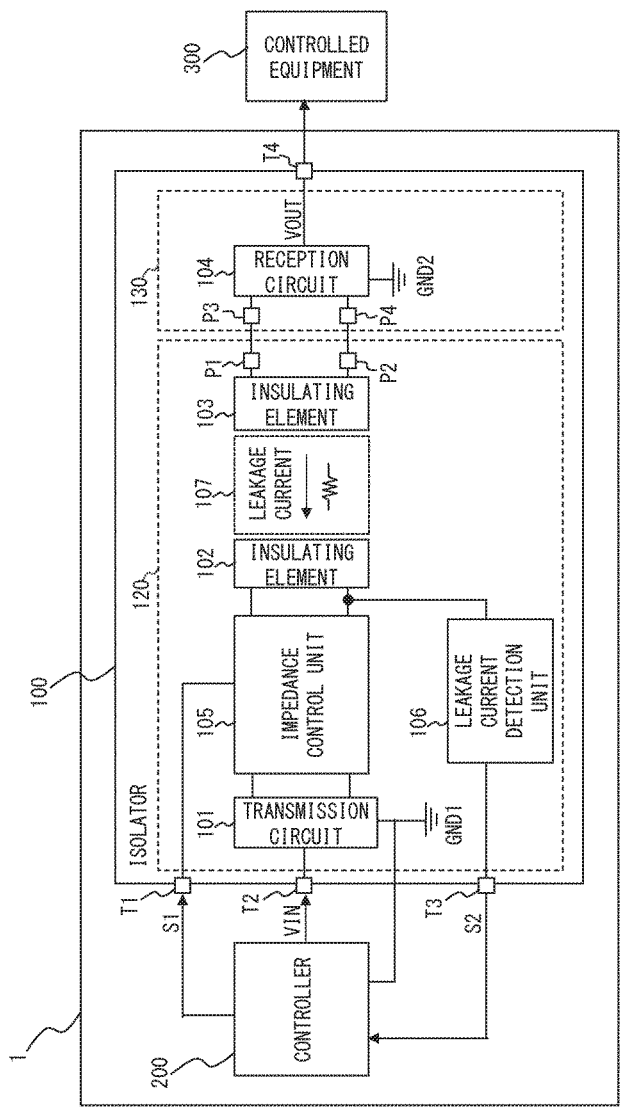
FIG. 1 is a configuration diagram showing a configuration of a semiconductor device including an isolator in accordance with an embodiment 1.

Hereinafter, an embodiment 1 will be explained with reference to drawings. FIG. 1 shows a configuration of a semiconductor device including an isolator in accordance with the embodiment. As shown in FIG. 1, a semiconductor device 1 includes an isolator 100 and a controller 200, which is an MCU etc. In addition, controlled equipment 300, which is a controlled object of the controller 200, is connected to the semiconductor device 1.

The isolator 100 includes: a transmission-side chip 120; a reception-side chip 130; and external terminals T1 to T4. The isolator 100 is connected to the controller 200 through the external terminals T1 to T3, and is connected to the controlled equipment 300 through the external terminal T4.

The external terminal T1 is the terminal for inputting an impedance control signal S1 for controlling an impedance from the controller 200. The external terminal T2 is the terminal for inputting transmission data VIN from the controller 200. The external terminal T3 is the terminal for outputting an error signal S2, which is a detection result of a leakage current, to the controller 200. The external terminal T4 is the terminal for outputting reception data VOUT received through an insulating element to the controlled equipment 300.

The transmission-side chip 120 includes: a transmission circuit 101; an insulating element (a transmission-side insulating element) 102; an insulating element (a reception-side insulating element) 103; pads P1 and P2 connected to the insulating element 103; an impedance control unit 105; and a leakage current detection unit 106. The reception-side chip 130 includes a reception circuit 104, and pads P3 and P4 connected to the reception circuit 104.

The transmission data VIN is input to the transmission circuit 101 from the controller 200 through the external terminal T2, and the transmission circuit 101 generates an alternating current transmission signal based on the input transmission data VIN. The alternating current transmission signal is the signal on the basis of a reference potential GND1 (a first reference potential).

The insulating elements 102 and 103 are, for example, a coil and a capacitor. The alternating current transmission signal is supplied to the insulating element (a first insulating element) 102 from the transmission circuit 101 through the impedance control unit 105. An insulating film 107 is formed between the insulating elements 102 and 103.

The insulating element (a second insulating element) 103 is alternating current-coupled to the insulating element 102 through the insulating film 107, and thereby generates an alternating-current reception signal. The alternating current reception signal is the signal on the basis of a reference potential GND2 (a second reference potential) different from the reference potential GND.

The insulating element 103 and the reception circuit 104 are connected to each other through the pad P1 of the transmission-side chip 120 and the pad P3 of the reception-side chip 130, and are also connected to each other through the pad P2 of the transmission-side chip 120 and the pad P4 of the reception-side chip 130. The alternating current reception signal is input to the reception circuit 104 through the pads P1 and P3 and the pads P2 and P4. The reception circuit 104 reproduces the reception data VOUT based on the input alternating-current reception signal, and outputs the reception data VOUT to the controlled equipment 300 through the external terminal T4.

An impedance control signal S1 is input to the impedance control unit 105 from the controller 200 through the external terminal T1, and the impedance control unit 105 controls an impedance of the insulating element 102 to be high based on the input impedance control signal S1. The leakage current detection unit 106 detects the leakage current that flows between the insulating elements. Namely, the leakage current detection unit 106 detects the leakage current through the insulating element 102 in which the impedance has been controlled, and outputs an error signal S2, which is a detection result according to the leakage current, to the controller 200 through the external terminal T3.

Note that although in the example of FIG. 1, the impedance of the transmission-side insulating element 102 is controlled and the leakage current is detected through the insulating element 102 in which the impedance has been controlled, an impedance of the reception-side insulating element 103 may be controlled and the leakage current may be detected through the insulating element 103 in which the impedance has been controlled.

In testing the leakage current between the insulating elements, the controller 200 inputs a test preset signal that maintains a high level as the transmission data VIN. As a result of this, since the reception data VOUT of the reception circuit 104 and the controlled equipment 300 are controlled to be in a constant state, and the reference potential GND2 becomes higher than the reference potential GND1, the leakage current is generated. The controller 200 controls the impedance of the transmission-side insulating element 102 of the isolator 100 to be high, and detects the leakage current through the transmission-side insulating element 102 in the leakage current detection unit 106. The leakage current detection unit 106 transmits to the controller 200 the error signal S2 according to a leakage current amount. The controller 200 determines an insulating property (a deterioration state of the insulating film) from the received error signal S2, and controls operation of the isolator 100.

As described above, in the embodiment, the isolator controls the impedance of the insulating element to detect the leakage current, and outputs the error signal according to the detected leakage current. As a result of this, since deterioration of the insulating film can be detected before a breakdown, and it becomes possible to safely stop the isolator, reliability of the isolator can be improved.

Embodiment 2

Hereinafter, an embodiment 2 will be explained with reference to the drawings. In the embodiment, a configuration and operation of the isolator more specific than those shown in the embodiment 1 will be explained.

Figure 2:
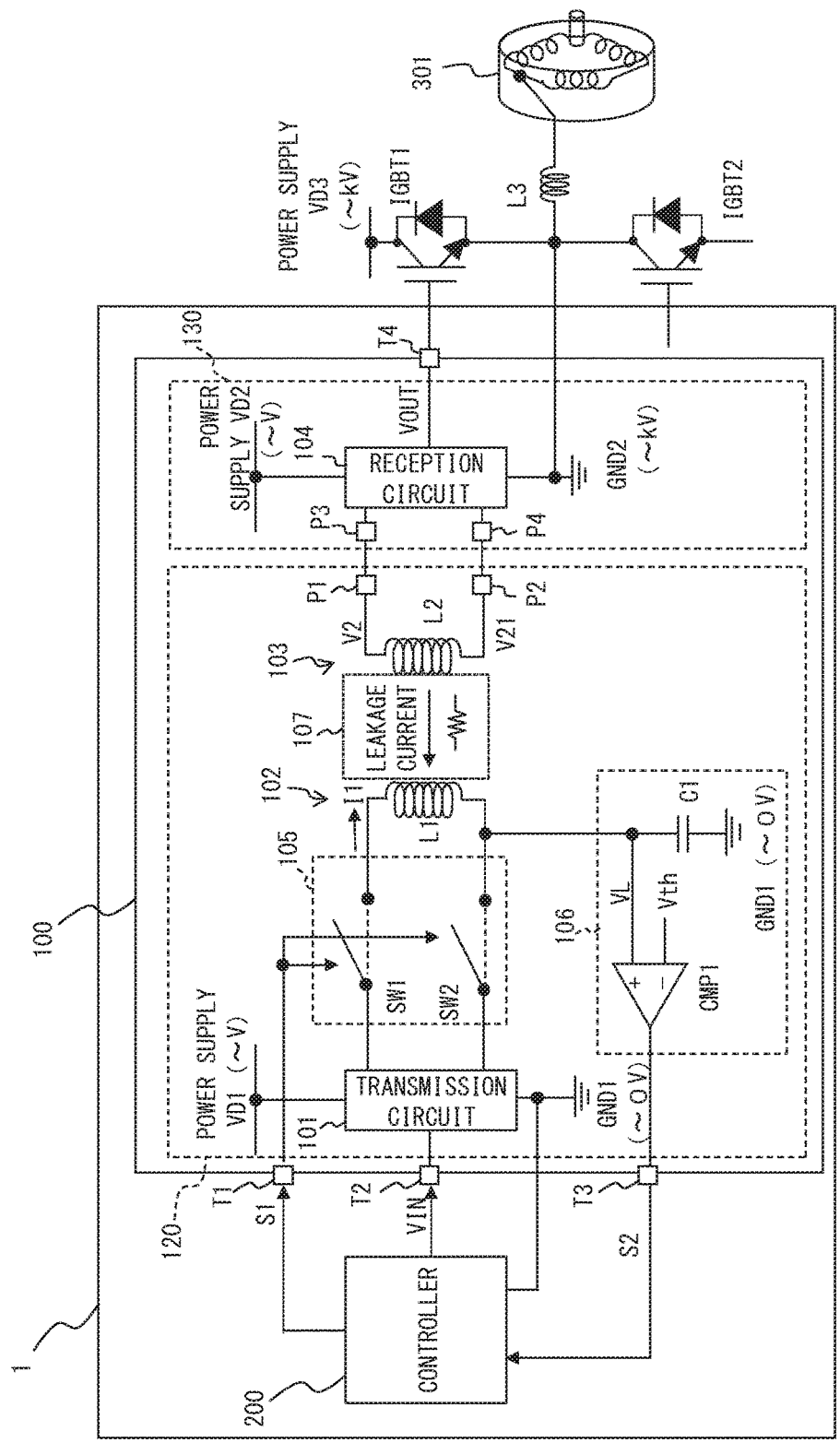
FIG. 2 is a configuration diagram showing a configuration of a control system including an isolator in accordance with an embodiment 2.

FIG. 2 shows a configuration of a motor control system including an isolator in accordance with the embodiment. The motor control system controls rotational operation of a motor 301 as one example of a controlled equipment 300, which is the controlled object. Note that the controlled equipment 300 may be a power supply circuit, a measuring instrument, a sensor, etc. in addition to the motor. As the motor and an IGBT, as long as the system of the embodiment is a system (an application) that can maintain a reference potential of a reception circuit side (a secondary side) higher than a reference potential of a transmission circuit side, other systems may be employed.

For example, similar to FIG. 16, the motor 301 is a three-phase motor, has a high-side IGBT and isolator and a low-side IGBT and isolator for each phase, only the high-side IGBT and isolator and the low-side IGBT of one phase of the three phases being shown in FIG. 2. Note that a gate driver may be included as in FIG. 16 if needed.

The semiconductor device 1 is connected to the motor 301 and IGBTs 1 and 2 in order to control the rotational operation of the motor 301. The IGBT 1 is a high-side motor driver, and the IGBT 2 is a low-side motor driver. In the IGBT 1, a gate is connected to the external terminal T4, a power supply VD3, which is a DC power supply for the IGBT, is supplied to a collector, and an emitter is connected to the motor 301 through the reference potential GND2, a collector of the IGBT 2, and a coil L3.

The semiconductor device 1 of FIG. 2 has a configuration similar to that of the semiconductor device 1 of FIG. 1, and further, includes specific circuit configurations of the insulating elements 102 and 103, the impedance control unit 105, and the leakage current detection unit 106.

Namely, similar to FIG. 1, the semiconductor device 1 includes the isolator 100 and the controller 200. The isolator 100 is connected to the controller 200 through the external terminals T1 to T3, and is connected to the IGBT 1 through the external terminal T4. The isolator 100 includes the transmission-side chip 120 and the reception-side chip 130.

The transmission-side chip 120 includes: the transmission circuit 101; the insulating element 102; the insulating element 103; the pads P1 and P2; the impedance control unit 105; and the leakage current detection unit 106. A power supply VD1 of several volts is supplied to the transmission circuit 101, and the reference potential GND1 of the transmission circuit 101 side from the insulating element 102 becomes approximately 0 V.

The reception-side chip 130 includes the reception circuit 104 and the pads P3 and P4. A power supply VD2 of several volts is supplied to the reception circuit 104, the power supply VD3 of several kilovolts is supplied to the IGBT 1 connected to the reception circuit 104, and the reference potential GND2 of the reception circuit 104 side from the insulating element 103 becomes approximately several kilovolts.

In the example of FIG. 2, a transmission-side coil L1 and a reception-side coil L2 are included as the insulating elements 102 and 103. Switches SW1 and SW2 are included as the impedance control unit 105. A capacitor C1 (parasitic capacitance) and a comparator CMP1 are included as the leakage current detection unit 106.

A connection relation of these configurations will be explained. A first output terminal to output an alternating-current transmission signal of the transmission circuit 101 is connected to one end of the coil L1 through the switch SW1, and a second output terminal to output the alternating-current transmission signal of the transmission circuit 101 is connected to another end of the coil L1 through the switch SW2.

The switch SW1 is connected between the first output terminal of the transmission circuit 101 and the one end of the coil L1, and a control terminal thereof is connected to the external terminal T1. The switch SW1 is turned on/off according to the impedance control signal S1 input from the controller 200 to the control terminal, and switches connection/disconnection of the first output terminal of the transmission circuit 101 and the one end of the coil L1.

The switch SW2 is connected between a second output terminal of the transmission circuit 101 and the other end of the coil L1, and a control terminal thereof is connected to the external terminal T1. The switch SW2 is turned on/off according to the impedance control signal S1 input from the controller 200 to the control terminal, and switches connection/disconnection of the second output terminal of the transmission circuit 101 and the other end of the coil L1.

One end of the capacitor C1 is connected to the other end of the coil L1, and another end thereof is connected to the reference potential GND1. The capacitor C1 charges a leakage current that flows through the coil L1, and generates a leakage voltage VL, which is a voltage according to the leakage current.

In the comparator CMP1, a positive input terminal is connected to the one end of the capacitor C1 (the other end of the coil L1), a threshold value (a threshold value voltage) Vth is input to a negative input terminal, and an output terminal is connected to the external terminal T3. The comparator CMP1 compares the leakage voltage VL charged by the capacitor C1 with the threshold value Vth, and outputs a comparison result to the controller 200 as the error signal S2. When the leakage voltage VL is larger than the threshold value Vth, the comparator CMP1 outputs a high level signal to the error signal S2.

Figure 3A:
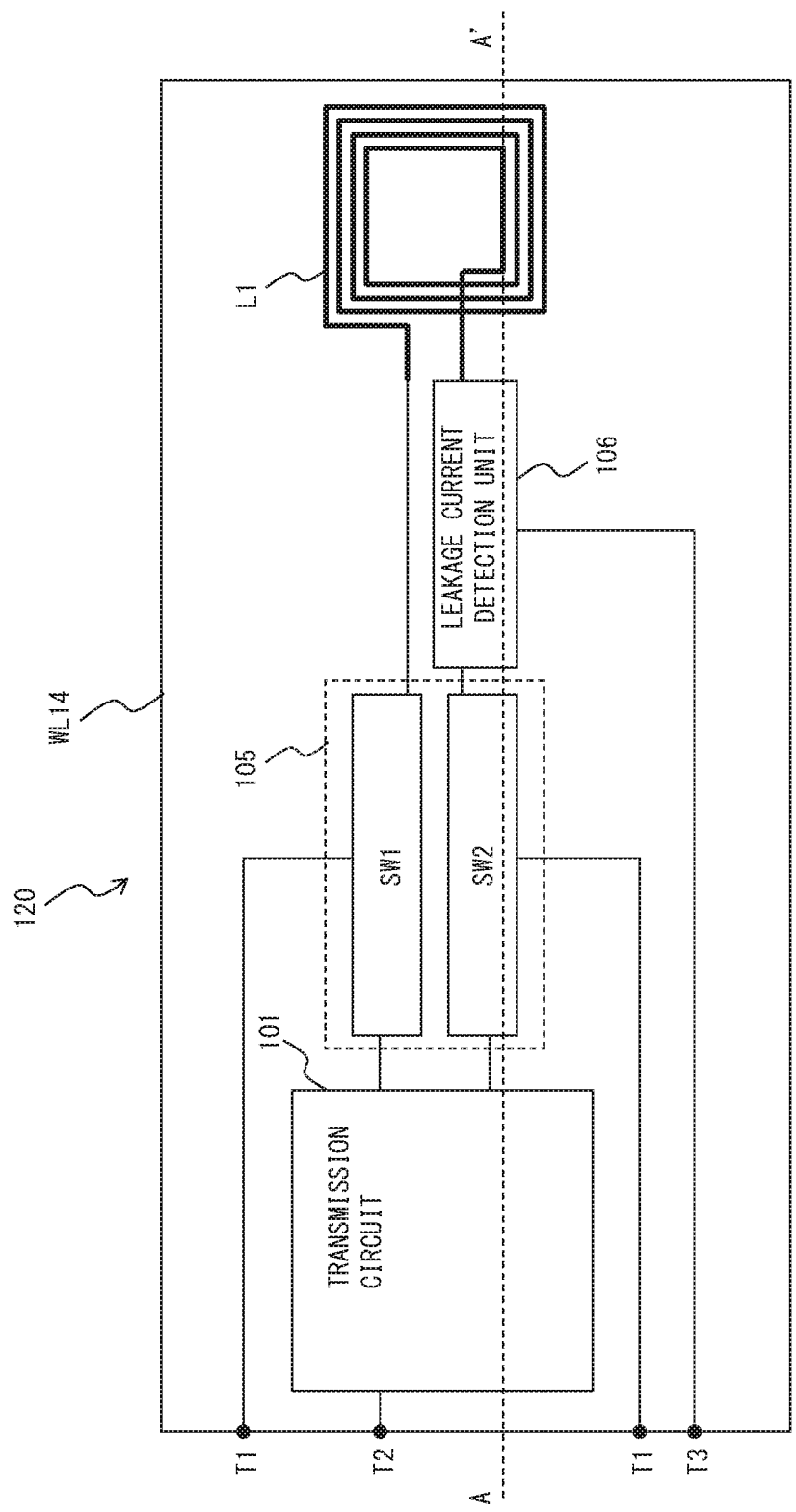
FIG. 3A is a plan diagram schematically showing a mounting example of the isolator in accordance with the embodiment 2.
Figure 3B:
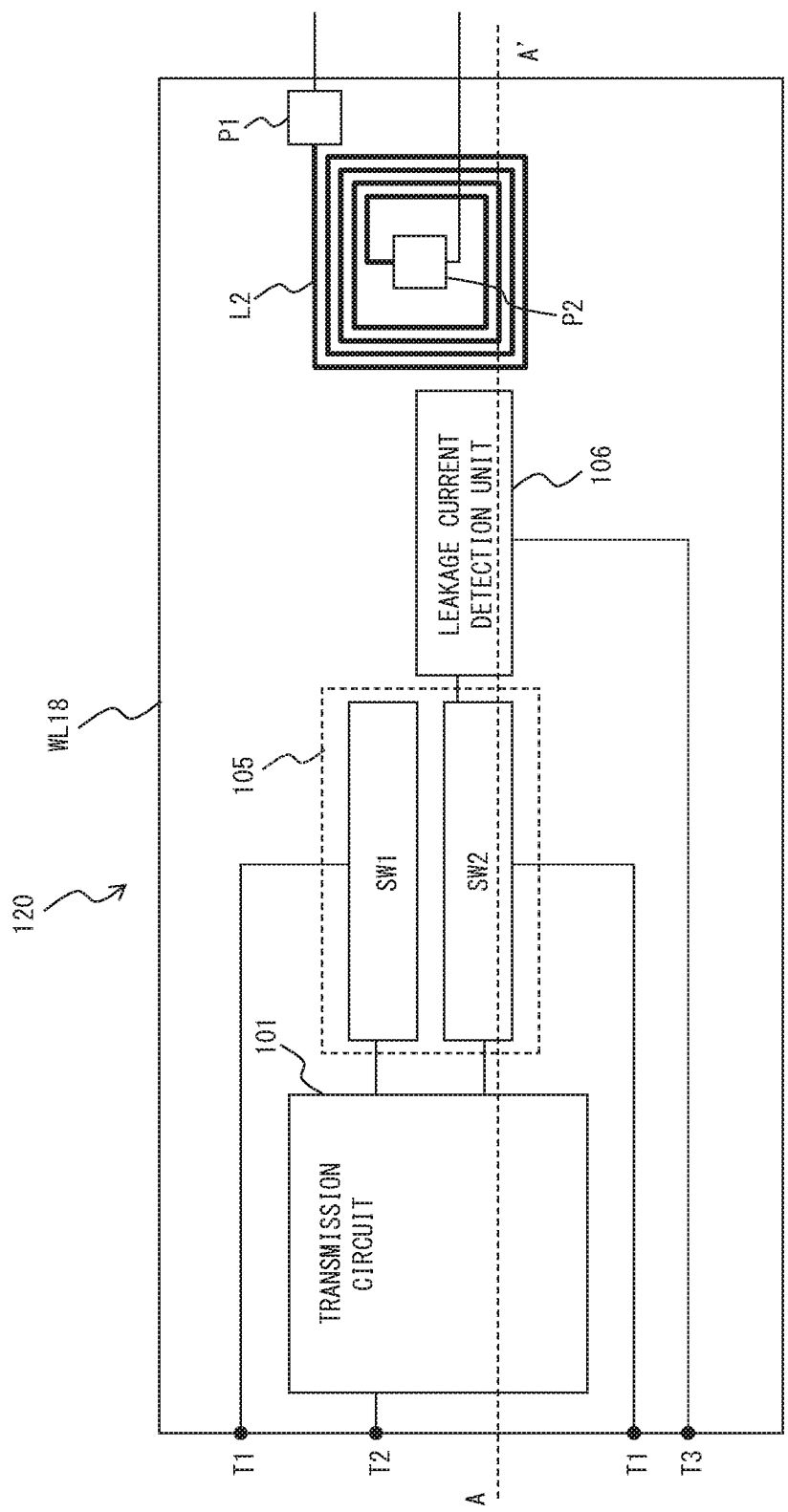
FIG. 3B is a plan diagram schematically showing a mounting example of the isolator in accordance with the embodiment 2.
Figure 3C:
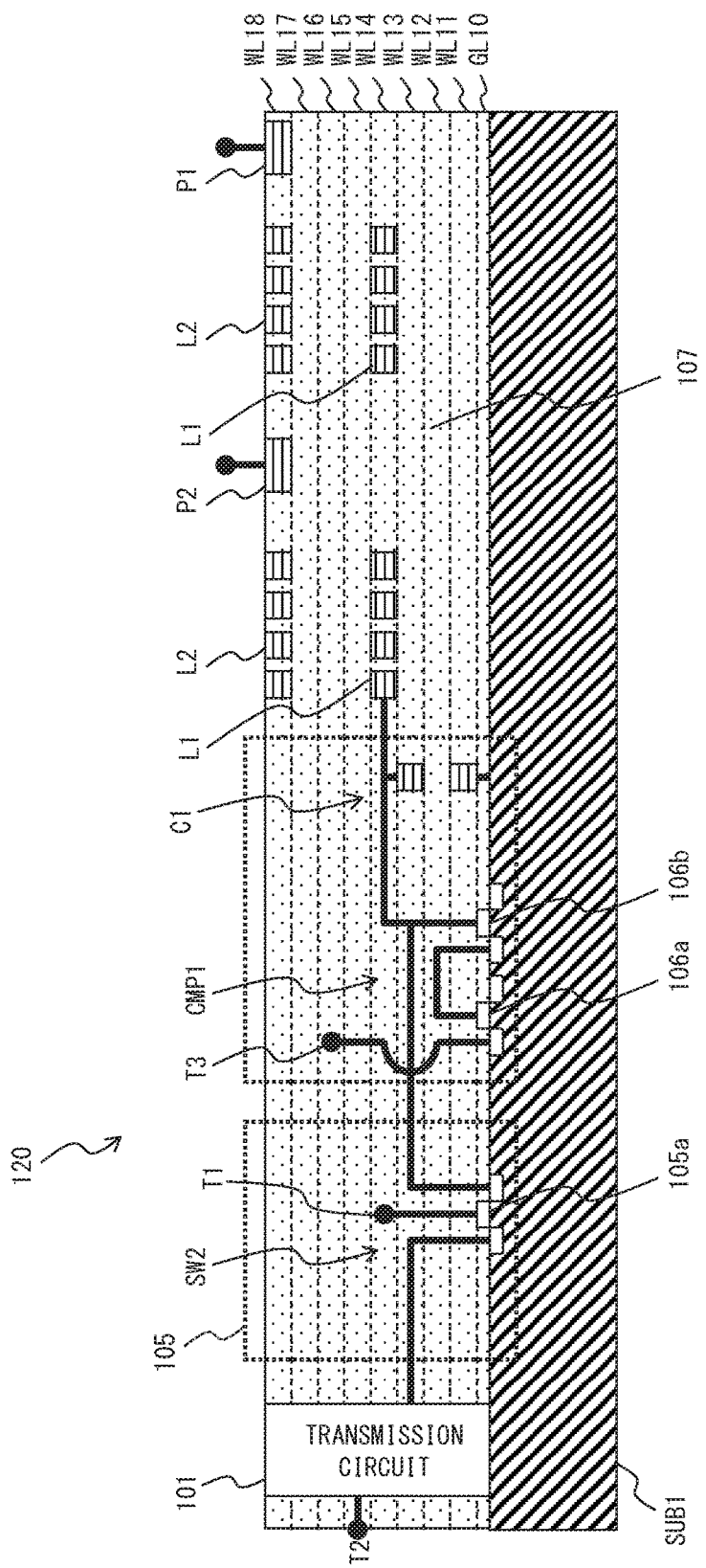
FIG. 3C is a cross-sectional diagram schematically showing a mounting example of the isolator in accordance with the embodiment 2.

FIG. 3A is one example of a plan view of a wiring layer in which the transmission-side coil L1 of the transmission-side chip 120 included in the isolator 100 of FIG. 2 is formed, FIG. 3B is one example of a plan view of a wiring layer in which the reception-side coil L2 of the transmission-side chip 120 is formed, and FIG. 3C is one example of a line A-A' cross-sectional diagram of the transmission-side chip 120 of FIGS. 3A and 3B.

As shown in FIGS. 3A to 3C, in the transmission-side chip 120, agate electrode layer GL10 and wiring layers WL11 to WL18 are formed on a silicon substrate SUB1 in a stacked manner in that order. In the gate electrode layer GL10 and the wiring layers WL11 to WL18, a gate electrode and a metal wiring included in a circuit of the transmission-side chip 120 are formed in desired patterns, and an interlayer insulating film 107 is formed so as to bury the gate electrode and the metal wiring.

The transmission circuit 101 is formed in the gate electrode layer GL10 and the wiring layers WL11 to WL18. A wiring is formed in the wiring layer WL15 so as to connect the external terminal T2 to which the transmission data VIN is input and the transmission circuit 101.

The switch SW2 of the impedance control unit 105 includes an MOS transistor 105a. The MOS transistor 105a has two diffusion layers formed at a surface of the silicon substrate SUB1, and a gate electrode formed in gate electrode layer GL10 on the silicon substrate SUB1.

A wiring of the wiring layer WL13, and a contact hole penetrating from the wiring layer WL13 to the gate electrode layer GL10 are formed so as to connect the transmission circuit 101 and one diffusion layer of the MOS transistor 105a. A contact hole penetrating from the wiring layer WL14 to the gate electrode layer GL10 is formed so as to connect a gate of the MOS transistor 105a and the external terminal T1 to which the impedance control signal S1 is input.

Note that although a cross-sectional diagram is omitted, the switch SW1 of the impedance control unit 105 includes, similar to the switch SW2, an MOS transistor, the transmission circuit 101 and one diffusion layer of the MOS transistor are connected to each other, a gate of the MOS transistor is connected to the external terminal T1, and another diffusion layer of the MOS transistor is connected to the transmission-side coil L1.

The comparator CMP1 of the leakage current detection unit 106 includes MOS transistors 106a and 106b. The MOS transistors 106a and 106b respectively have two diffusion layers formed at the surface of the silicon substrate SUB1, and a gate electrode formed in the gate electrode layer GL10 on the silicon substrate SUB1.

A contact hole penetrating from the wiring layer WL16 to the gate electrode layer GL10 is formed so as to connect one diffusion layer of the MOS transistor 106a and the external terminal T3 from which the error signal S2 which has detected the leakage current is output. A wiring of the wiring layer WL12 and two contact holes penetrating from the wiring layer WL12 to the gate electrode layer GL10 are formed so as to connect a gate of the MOS transistor 106a and the one diffusion layer of the MOS transistor.

The capacitor C1 of the leakage current detection unit 106 includes wirings formed in the wiring layer WL11 and the wiring layer WL13, and the insulating film 107 between the wirings. A contact hole penetrating the gate electrode layer GL10 is formed so as to connect the wiring of the wiring layer WL11 side of the capacitor C1 and the silicon substrate SUB1.

The transmission-side coil L1 includes a wiring spirally patterned in the wiring layer WL14. The contact hole penetrating from the wiring layer WL13 to the gate electrode layer GL10, the wiring of the wiring layer WL13, the contact hole penetrating from the wiring layer WL14 to the gate electrode layer GL10, and a wiring of the wiring layer WL14 are formed so as to connect the transmission-side coil L1 and another diffusion layer of the MOS transistor 105a, a gate of the MOS transistor 106b, and the wiring of the wiring layer WL13 side of the capacitor C1.

The reception-side coil L2 includes a wiring spirally patterned in the wiring layer WL18. The transmission-side coil L1 and the reception-side coil L2 are formed so as to face each other through the interlayer insulating film 107 formed in the wiring layers WL15 to WL17. The reception-side coil L2 is connected to the pads P1 and P2 formed in the wiring layer WL18.

Figure 4A:
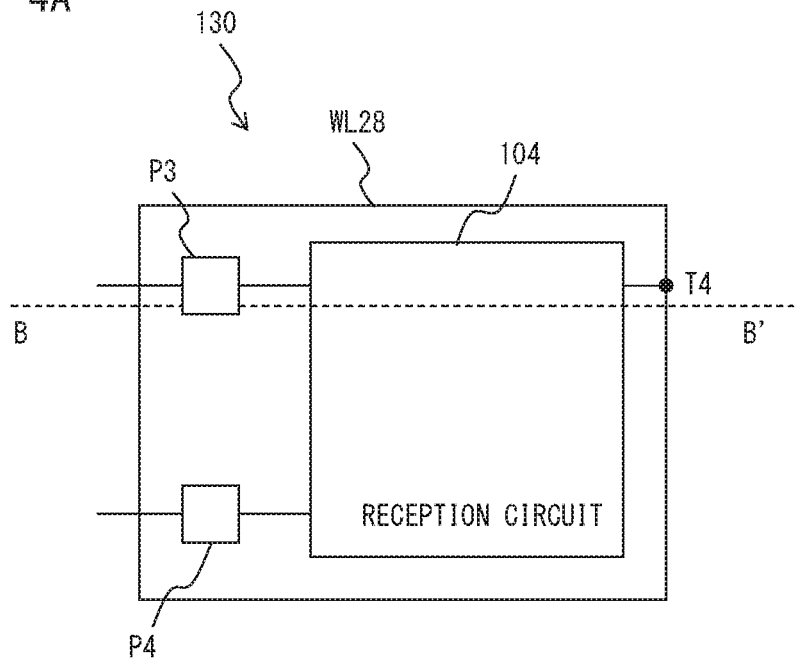
FIG. 4A is a plan diagram schematically showing a mounting example of the isolator in accordance with the embodiment 2.
Figure 4B:
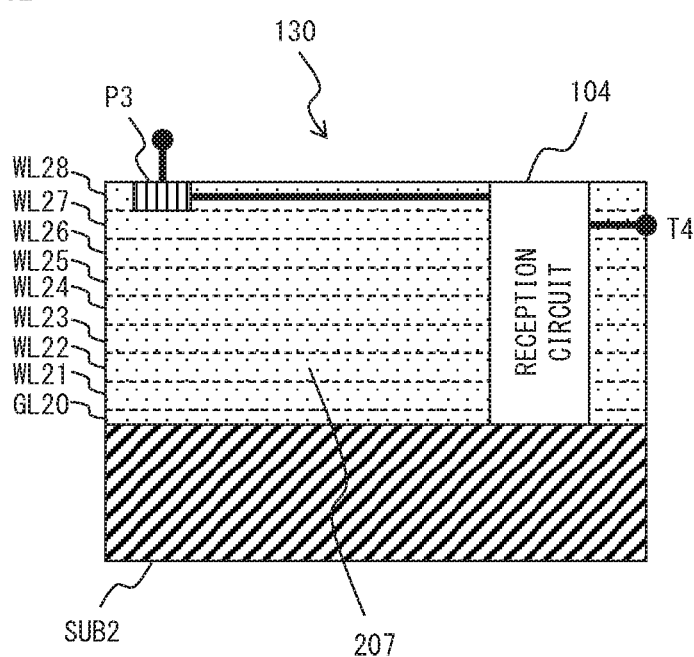
FIG. 4B is a cross-sectional diagram schematically showing a mounting example of the isolator in accordance with the embodiment 2.

FIG. 4A is one example of a plan diagram of the reception-side chip 130 included in the isolator 100 of FIG. 2, and FIG. 4B is one example of a line B-B' cross-sectional diagram of the reception-side chip 130 of FIG. 4A.

As shown in FIGS. 4A and 4B, similarly to the transmission-side chip 120, in the reception-side chip 130, a gate electrode layer GL20 and wiring layers WL21 to WL28 are formed on a silicon substrate SUB2 in a stacked manner in that order, and an interlayer insulating film 207 is formed between the respective wirings.

The reception circuit 104 is formed in the gate electrode layer GL20 and the wiring layers WL21 to WL28. The pad P3 is formed in the wiring layer WL28, and a wiring is formed in the wiring layer WL28 so as to connect the pad P3 and the reception circuit 104. Note that although a cross-sectional diagram of the pad P4 is omitted, similarly to the pad P3, the pad P4 is formed in the wiring layer WL28, and is connected to the reception circuit 104 by the wiring of the wiring layer WL28. In addition, a wiring is formed in the wiring layer WL27 so as to connect the external terminal T4 from which the reception data VOUT is output and the reception circuit 104.

Figure 5:
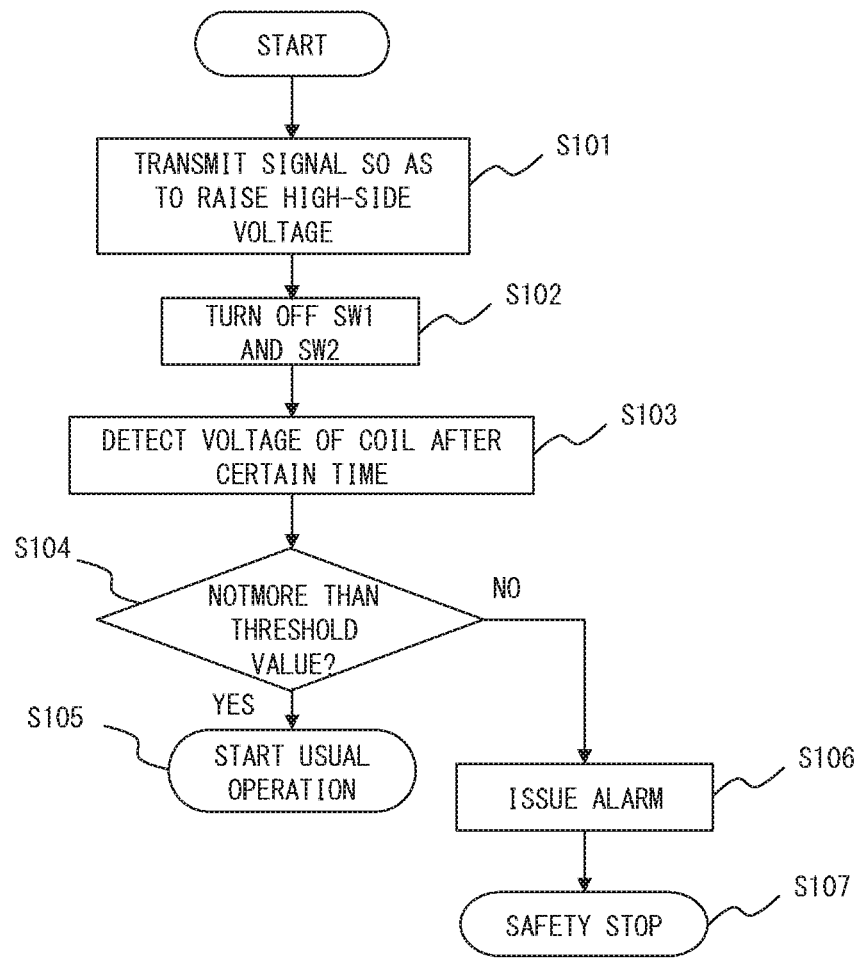
FIG. 5 is a flow chart showing a method for controlling an isolator in accordance with the embodiment 2.

Next, a method for controlling an isolator in accordance with the embodiment will be explained using FIGS. 5 and 6. FIG. 5 is a flow chart showing a method for controlling the isolator 100 (a test to detect a leakage current or a method for testing insulating film deterioration), and FIG. 6 is a timing chart showing an example of signal wave forms of the control method.

As shown in FIG. 5, first, the controller 200 transmits a signal so as to raise a high-side voltage (S101). In detecting a leakage current between the insulating elements, the controller 200 connected outside the isolator 100 first transmits the transmission data VIN (a preset signal) keeping a high level (Hi) to the isolator 100 (401 of FIG. 6). The transmission circuit 101 then applies a voltage to the transmission-side coil L1 according to rise of the transmission data VIN, and a current I1 in a positive direction temporarily flows through the transmission-side coil L1 (402 of FIG. 6). For this reason, in the reception-side coil L2, an electromotive force according to change of the current I1 of the transmission-side coil L1 is generated, and an induced voltage V2 temporarily rises (403 of FIG. 6). The reception circuit 104 raises the reception data VOUT to a high level since the induced voltage V2 rises (404 of FIG. 6).

Figure 6:
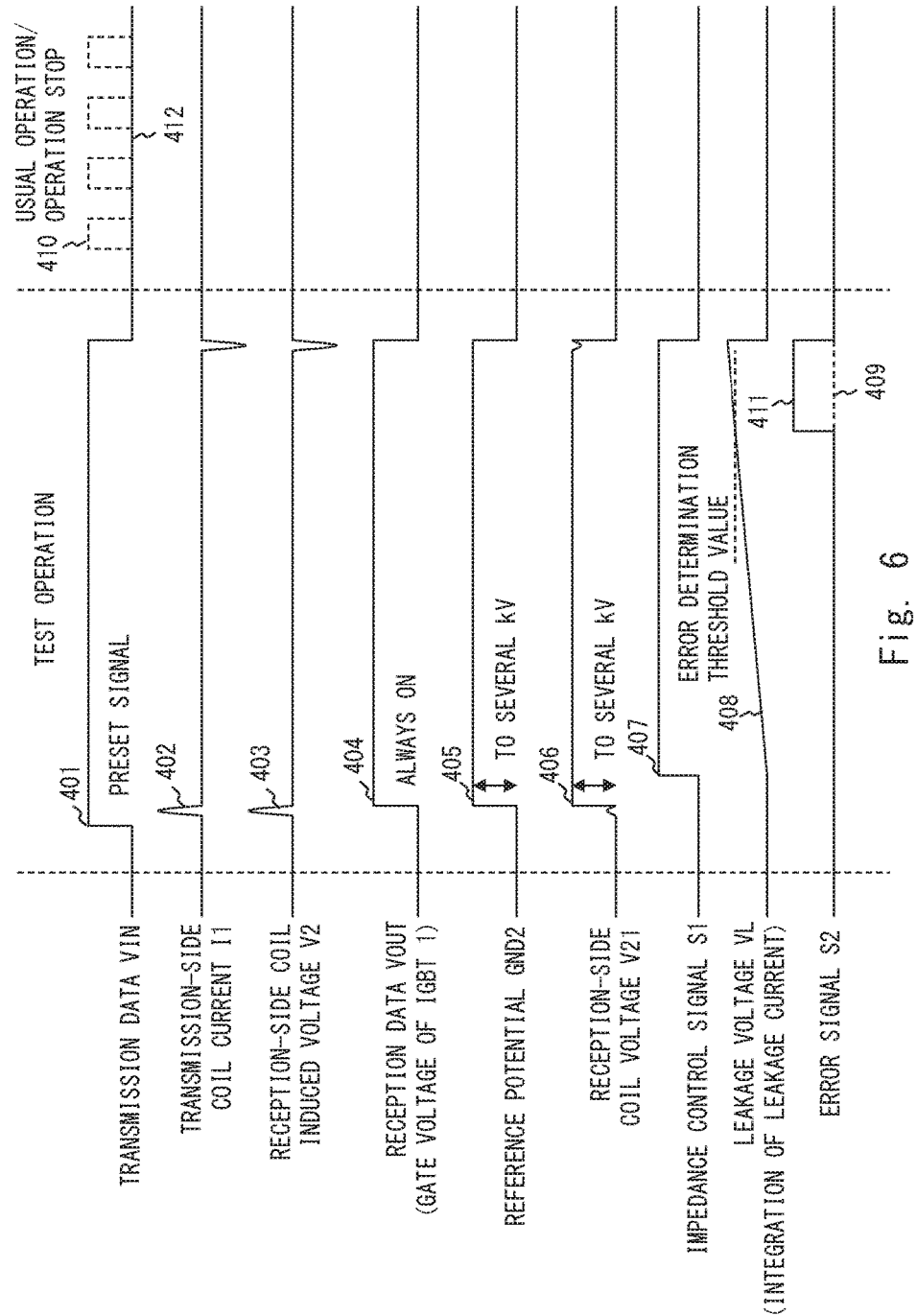
FIG. 6 is a timing chart showing operation of the isolator in accordance with the embodiment 2.

As a result of this, the state of the IGBT 1 connected to a subsequent stage of the isolator 100 becomes an always ON state, the reference potential GND2 is fixed to approximately a power supply voltage (to kV) of the IGBT 1 (405 of FIG. 6), and a voltage V21 of the reception-side coil is also fixed to approximately the power supply voltage level (to kV) after the change of the induced voltage V2 (406 of FIG. 6).

Subsequently, the controller 200 turns off the switches SW1 and SW2 (S102). The controller 200 raises the impedance control signal S1 to a high level (407 of FIG. 6). As a result of this, since the switches SW1 and SW2 of the transmission-side chip 120 of the isolator 100 become off, and the coil L1, which is a transmission-side insulating element, and the transmission circuit 101 are electrically cut off, both terminals of the coil L1, which is the transmission-side insulating element, come to have high impedances.

Subsequently, the isolator 100 detects the leakage voltage VL of the coil L1 after a certain time (S103). By turning off the switches SW1 and SW2, inflow and outflow of a current between the coil L1, which is the transmission-side insulating element, and the transmission circuit 101 are prevented, and detection sensitivity of the leakage current between the insulating elements of the coils L1 and L2 improves. When the switches SW1 and SW2 are turned off, the coil L1, which is the transmission-side insulating element, is in a potential state just before the switches are turned off. Since a potential of the reception circuit 104 is higher than a potential of the transmission circuit 101 (by several kilovolts), a leakage current according to a deterioration state of the insulating film 107 flows into the coil L1, which is the transmission-side insulating element, from the coil L2, which is a reception-side insulating element. The leakage current is charged in voltage detection means added to the coil L1, which is the transmission-side insulating element, for example, the capacitor C1, which is capacitance (parasitic capacitance is also included), and is converted into the voltage (the leakage voltage VL). Since the leakage voltage VL is a value obtained by integrating the leakage current, it rises along with time (408 of FIG. 6).

Subsequently, the isolator 100 determines whether or not the leakage voltage VL of the coil L1 is more than the threshold value Vth (S104). A voltage of the capacitor C1 is input to the comparator CMP1, a voltage value corresponding to a leakage current value used as a criterion for determining normality/abnormality of the insulating film is set to the threshold value (a reference voltage) Vth of the comparator CMP1, and thereby deterioration of the insulating film is detected. The comparator CMP1 compares the leakage voltage VL obtained by integrating a leakage current that flows while the impedance control signal S1 is in a high level, with the threshold value Vth. A comparison result of the comparator CMP1 is output to the controller 200 as the error signal S2, and the controller 200 controls operation of the isolator 100 according to the error signal S2.

When the leakage voltage VL of the coil L1 is not more than the threshold value Vth, the controller 200 starts a usual operation (S105). When the leakage voltage VL is not more than the threshold value, the comparator CMP1 keeps the error signal S2 to be a low level (409 of FIG. 6). Since the error signal S2 of the low level corresponding to the leakage current not more than a prescribed value is input for a predetermined period (a period when the impedance control signal S1 is in the high level), the controller 200 determines the isolator 100 to be normal, and starts a usual operation (410 of FIG. 6). The controller 200 inputs the transmission data VIN for controlling the motor 301 to the isolator 100, drives the IGBT 1, and starts rotation of the motor 301.

In addition, when the leakage voltage VL of the coil L1 is larger than the threshold value, the controller 200 outputs an alarm (S106), and performs a safety stop (S107). When the leakage voltage VL exceeds the threshold value, the comparator CMP1 raises the error signal S2 to a high level (411 of FIG. 6). Since the error signal S2 of the high level corresponding to the leakage current not less than the prescribed value was input within the predetermined period, the controller 200 determines the insulating film of the isolator 100 to be abnormal, and stops the operation of the isolator 100 (412 of FIG. 6). The controller 200 inputs the transmission data VIN of a low level to the isolator 100, turns off the IGBT 1, and stops the rotation of the motor 301. As a result of this, destruction of the whole system is prevented beforehand.

As described above, in the embodiment, as a specific example of the embodiment 1, the insulating elements 102 and 103 include the coils L1 and L2, the impedance control unit 105 includes the switches SW1 and SW2, and the leakage current detection unit 106 includes the capacitor C1 and the comparator CMP1. In this configuration, the impedance of the coil, which is the insulating element, is controlled to detect the leakage current, and the error signal according to the detected leakage current is transmitted. As a result of this, since deterioration of the insulating film can be detected before a breakdown between the coils, and it becomes possible to safely stop the isolator, reliability of the isolator can be improved.

Embodiment 3

Hereinafter, an embodiment 3 will be explained with reference to the drawings. The embodiment is an example of adding means for applying an initial potential to an insulating element that detects a leakage current to the isolator shown in the embodiment 2, and of determining whether or not fluctuation of the leakage current falls within a range of a first threshold value to a second threshold value.

Figure 7:
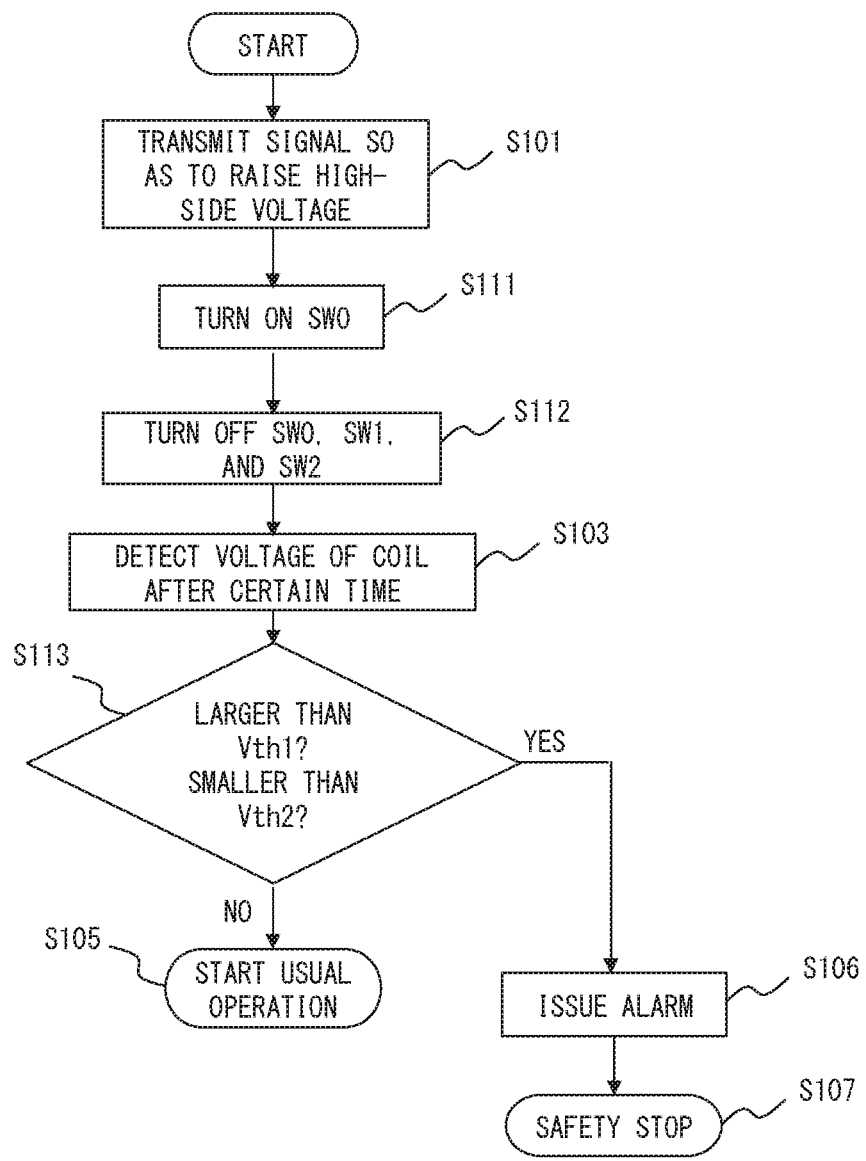
FIG. 7 is a flow chart showing a method for controlling an isolator in accordance with the embodiment 3.
Figure 8:
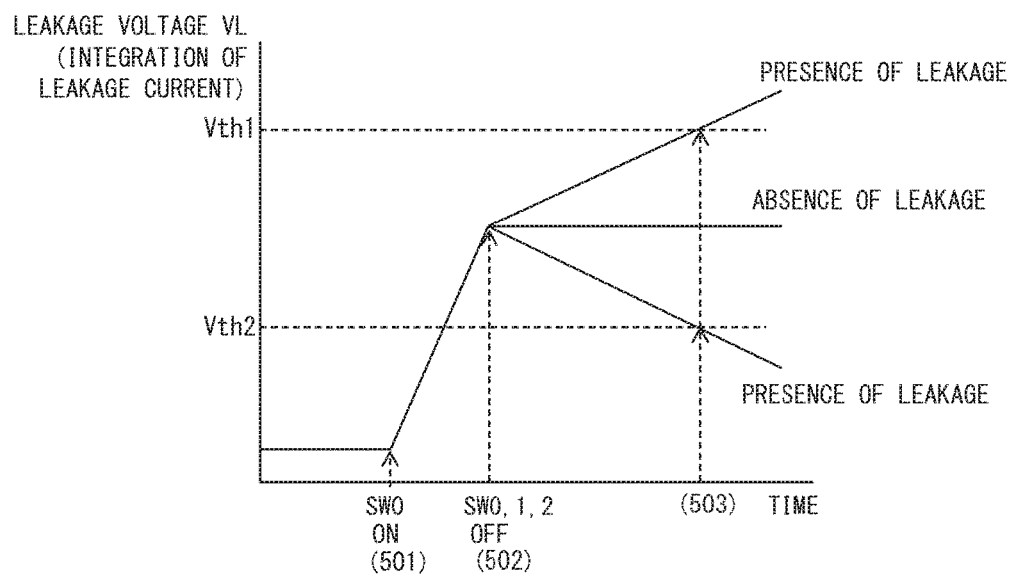
FIG. 8 is a waveform chart showing operation of the isolator in accordance with the embodiment 3.

A method for controlling the isolator in accordance with the embodiment will be explained using FIG. 7 and FIG. 8. FIG. 7 is a flow chart showing a method for controlling the isolator 100 (a test to detect a leakage current or a method for testing insulating film deterioration), and FIG. 8 shows an example of signal wave forms of the voltage VL of a transmission-side insulating element in the control method.

As shown in FIG. 7, first, similarly to FIG. 5 of the embodiment 2, the controller 200 transmits a signal so as to raise a high-side voltage (S101). Similarly to FIG. 6, when the controller 200 transmits a preset signal of a high level to the isolator 100, the state of the IGBT 1 becomes an on state through the coils L1 and L2, and the reference potential GND2 rises.

Subsequently, the controller 200 turns on the switch SW0 (S111), and after that, turns off the switches SW0, SW1, and SW2 (S112).

In the embodiment 2, after S101, the transmission-side insulating element and the transmission circuit are cut off by the switches SW1 and SW2. At this time, since the transmission-side insulating element is in a potential state before the switches are turned off, the potential is unfixed. Since the initial potential of the insulating element greatly affects detection sensitivity of the leakage current, the initial potential is controlled by the switch SW0 in the embodiment.

Namely, in the embodiment, before controlling an impedance of the insulating element, the controller 200 sets the bias control signal S0 to be a high level, and turns on the switch SW0 (501 of FIG. 8). In that case, an arbitrary initial voltage (for example, a VDD/2) is previously applied by the transmission circuit 101 connected to the coil L1, which is the transmission-side insulating element, through the switch SW0, and a power supply Vbias. After that, the controller 200 sets the bias control signal S0 to be a low level, sets the impedance control signal S1 to be a high level, and turns off the switches SW0, SW1, and SW2 (502 of FIG. 8).

Subsequently, the isolator 100 detects the leakage voltage VL of the coil L1 after the certain time (S103), and determines whether or not the leakage voltage VL of the coil L1 is larger than the first threshold value Vth1, or whether or not it is smaller than the second threshold value Vth2 (S113).

In the embodiment, in detection of the leakage current, the two comparators CMP1 and CMP2 connected in parallel with each other are used as voltage detectors. The threshold values (reference voltages) Vth1 and Vth2 are input to these comparators CMP1 and CMP2, respectively. The first threshold value Vth1 is connected to a reference side of the one comparator CMP1, the second threshold value Vth2 is connected to an input side of the other comparator CMP2, it is determined whether or not the leakage voltage VL fluctuated according to the leakage current falls within a range of the threshold values Vth1 to Vth2 (503 of FIG. 8), and a determination result is output from logic circuit OR1 to the controller 200 as the error signal S2.

When a voltage of the coil L1 falls within the range of the threshold values Vth1 to Vth2, the controller 200 determines that the isolator 100 is normal (absence of the leakage current), and starts a usual operation (S105). In the comparator CMP1, when the leakage voltage VL is not more than the threshold value Vth1, an output signal is at a low level, while in the comparator CMP2, when the leakage voltage VL is not less than the threshold value Vth2, an output signal is at a low level, and the logic circuit OR1 keeps the error signal S2 to be a low level. Since the error signal S2 of the low level corresponding to the leakage current within a range of a prescribed value is input for a predetermined period (a period when the impedance control signal S1 is at a high level), the controller 200 determines the isolator 100 to be normal, and starts the usual operation.

In addition, when voltage rise of the leakage voltage VL of the coil L1 becomes larger than the threshold value Vth1, or when voltage drop thereof becomes lower than the threshold value Vth2, the controllers 200 determines the isolator 100 to be abnormal (presence of the leakage current), outputs an alarm (S106), and performs a safety stop (S107). Since the comparator CMP1 sets the output signal to be a high level when the leakage voltage VL exceeds the threshold value Vth1, and the comparator CMP2 sets the output signal to be the high level when the leakage voltage VL becomes lower than the threshold value Vth2, the logic circuit OR1 raises the error signal S2 to be a high level.

Since the error signal S2 of the high level corresponding to the leakage current that does not fall within the range of the prescribed value was input within the predetermined period, the controller 200 determines the insulating film of the isolator 100 to be abnormal, and stops operation of the isolator 100. As a result of this, destruction of the whole system is prevented beforehand.

As described above, in the embodiment, with respect to the embodiment 2, the initial potential of the insulating element is set to be constant by the switch SW0, and the leakage current within the range of the threshold values Vth1 and Vth2 is detected by the comparators CMP1 and CMP2. According to such a configuration, the leakage current can be detected not only in a case where a current flows into the leakage current detection unit 106, but also in a case where the current flows out of the leakage current detection unit 106. Namely, there is a case where the leakage current flows from the coil L2 to the coil L1 and a case where the leakage current flows from the coil L1 to the coil L2 depending on a potential difference between the coil L1 and the coil L2, and in the embodiment, the leakage current can be accurately detected in either case.

Embodiment 4

Hereinafter, an embodiment 4 will be explained with reference to the drawings. The embodiment is an example where memory means for storing a leakage voltage has been added to the isolator shown in the embodiment 2.

Figure 9:
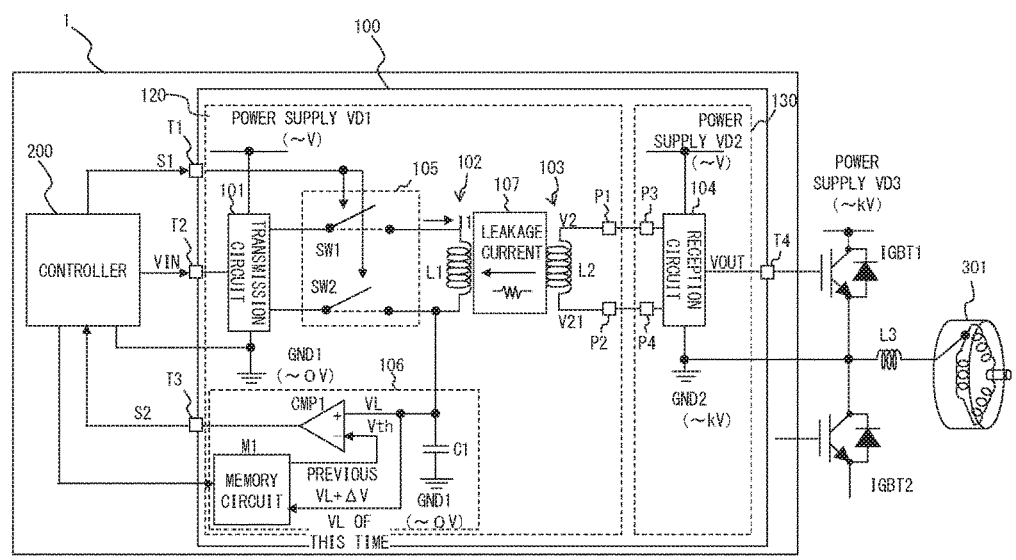
FIG. 9 is a configuration diagram showing a configuration of a control system including an isolator in accordance with an embodiment 4.

FIG. 9 shows a configuration of a motor control system including an isolator in accordance with the embodiment. In FIG. 9, compared with FIG. 2 of the embodiment 2, the leakage current detection unit 106 includes a memory circuit M1 in addition to the capacitor C1 and the comparator CMP1. Other configurations are similar to those of FIG. 2.

The memory circuit M1 is connected to a positive input terminal of the comparator CMP1, and is connected to a negative input terminal of the comparator CMP1. The leakage voltage VL compared by the comparator CMP1 this time is input to the memory circuit M1, and the memory circuit M1 stores the input voltage VL. In addition, the memory circuit M1 outputs the leakage voltage VL+ΔV as the threshold value Vth of the comparator CMP1 of this time, the leakage voltage VL having been used in a previous comparison of the comparator CMP1 and having been stored.

Figure 10:
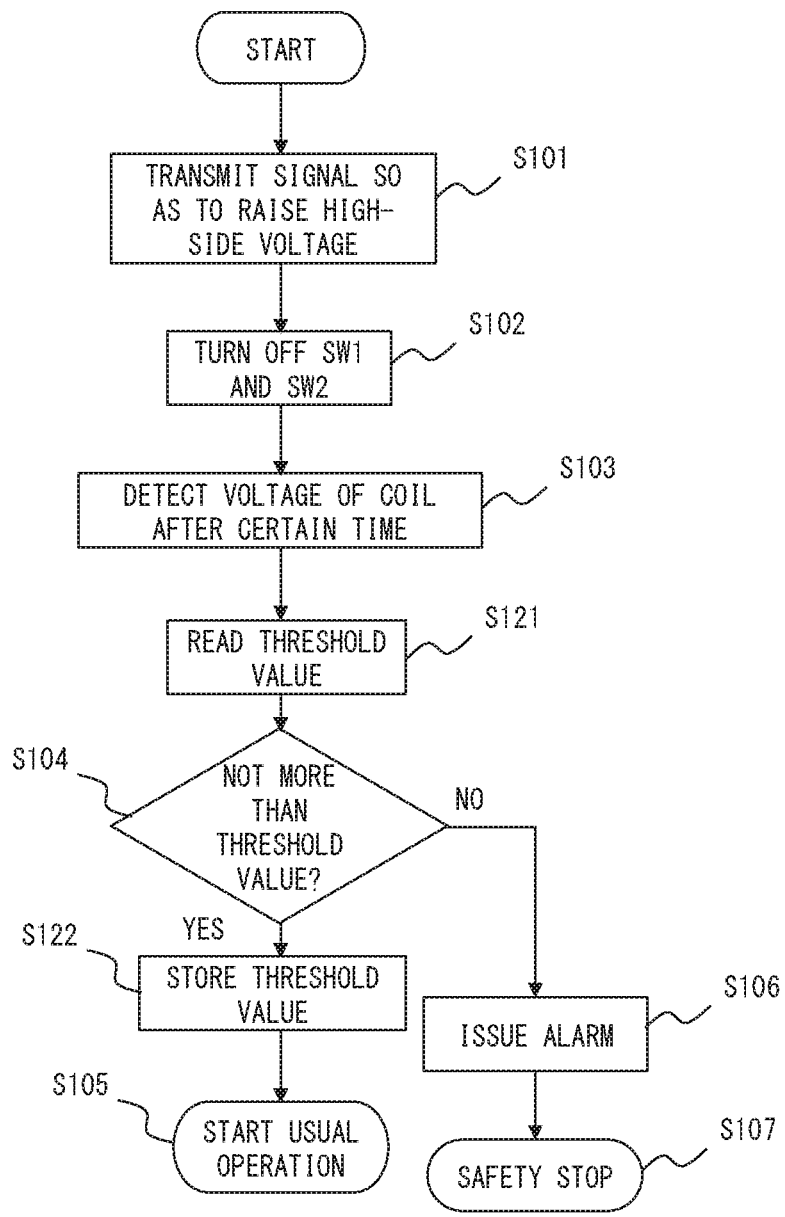
FIG. 10 is a flow chart showing a method for controlling an isolator in accordance with the embodiment 4.

FIG. 10 is a flow chart showing a method for controlling the isolator 100 (a test to detect a leakage current or a method for testing insulating film deterioration) in accordance with the embodiment.

As shown in FIG. 10, first, similarly to FIG. 5 of the embodiment 2, the controller 200 transmits a signal so as to raise a high-side voltage (S101), and turns off the switches SW1 and SW2 (S102).

Subsequently, the isolator 100 detects the leakage voltage VL of the coil L1 after a certain time (S103). The isolator 100 then reads the threshold value Vth from the memory circuit M1 (S121), and determines whether or not the leakage voltage VL of the coil L1 is not more than the read threshold value Vth (S104).

The memory circuit M1 which has stored the leakage voltage VL detected in a previous test of the leakage current reads the previous leakage voltage VL+ΔV as the threshold value Vth, and inputs it to the negative input terminal of the comparator CMP1. In that case, the comparator CMP1 compares a current leakage voltage of the coil L1 with the previous leakage voltage VL+ΔV.

When the leakage voltage VL of the coil L1 is not more than the threshold value Vth, the memory circuit M1 stores the leakage voltage of the coil L1 (S122), and the controller 200 starts a usual operation (S105). When the leakage voltage VL of this time is not more than the previous leakage voltage VL+ΔV, the comparator CMP1 keeps the error signal S2 to be a low level. In that case, the memory circuit M1 stores the leakage voltage VL compared by the comparator CMP1 this time. In addition, since the error signal S2 of the low level is input for a predetermined period, the controller 200 determines the isolator 100 to be normal, and starts the usual operation.

In addition, when the leakage voltage VL of the coil L1 is larger than the threshold value Vth, the controller 200 outputs an alarm (S106), and performs a safety stop (S107). When the leakage voltage VL of this time exceeds the previous leakage voltage VL+ΔV, the comparator CMP1 raises the error signal S2 to be a high level. Since the error signal S2 of the high level was input within the predetermined period, the controller 200 determines the insulating film of the isolator 100 to be abnormal, and stops operation of the isolator 100. As a result of this, destruction of the whole system is prevented beforehand.

With the method for prescribing an abnormality determination criterion of the insulating film by a constant leakage current value, sufficient detection accuracy may not be obtained due to effects of various variations and noise. Consequently, in the embodiment, a state of the insulating film at the time of the previous test is set to be a determination criterion, a difference of the leakage current from this state is observed, and thereby abnormality is determined. When the leakage voltage VL of the comparator CMP1 generated by charging the leakage current exceeds the threshold value (the reference voltage) Vth, the error signal S2 is transmitted to the controller 200 as indicating insulating film deterioration. Since a voltage applied between the insulating elements is decided substantially by a power supply voltage of the IGBT 1, the leakage current value becomes substantially the same in every test as long as there is no deterioration in the insulating film.

Consequently, a leakage current measurement result (VL) is held in the memory circuit M1, such as a register, at the time of the test, and the read previous leakage voltage VL+ΔV is set to the threshold value Vth at the time of a next test. Here, ΔV is an arbitrary voltage margin, and may be introduced to eliminate the effect of variations or noise.

As described above, in the embodiment, with respect to the embodiment 2, the memory circuit M1 is included that stores the leakage voltage according to the leakage current, and the leakage voltage used in the previous test is used for the threshold value for determining a next leakage voltage. As a result of this, since fluctuation of the leakage current can be detected, a deterioration state of the insulating film can be accurately detected.

Embodiment 5

Hereinafter, an embodiment 5 will be explained with reference to the drawings. The embodiment is an example where means for stopping the isolator according to detection of a leakage current has been added to the isolator shown in the embodiment 2.

Figure 11:
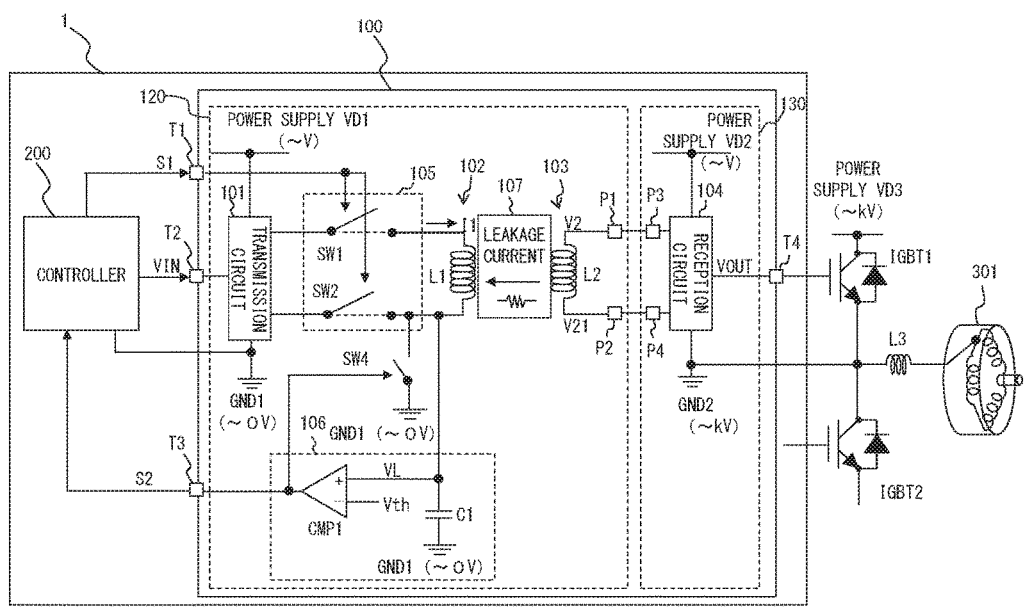
FIG. 11 is a configuration diagram showing a configuration of a control system including an isolator in accordance with an embodiment 5.

FIG. 11 shows a configuration of a motor control system including an isolator in accordance with the embodiment. In FIG. 11, compared with FIG. 2 of the embodiment 2, a switch SW4 is included in the transmission-side chip 120 of the isolator 100. Other configurations are similar to those of FIG. 2.

The switch SW4 is connected between the other end of the coil L1 and the reference potential GND1, and a control terminal is connected to the output terminal of the comparator CMP1. The switch SW4 is turned on/off according to the error signal S2 input to the control terminal from the comparator CMP1, and switches connection/disconnection of the other end of the coil L1 and the reference potential GND1. The switch SW4 can also be called a reference potential supply circuit in which the coil L1 is set to be the reference potential GN1 according to the error signal S2.

In each of the above-described embodiments, it is important to secure accuracy of detection of insulation deterioration and a feedback time of a detection result. For example, in an actual measurement result of Masayuki Hikita et al., "New Approach to Breakdown Study by Measuring Pre-Breakdown Current in Insulating Materials", Japanese Journal of Applied Physics (JJAP), vol. 23, No. 12, December, 1984, pp. L886-L888, a time when an effect of insulating film deterioration starts to appear is several microseconds to several nanoseconds before destruction, and the more the insulating film approaches the destruction, the more a leakage current increases.

As described above, there is a trade-off in which the larger a leakage current is set as an error determination criterion in order to improve the accuracy of detection of the insulation deterioration, the shorter a time to spare becomes before a detection result is fed back to the controller 200, to thereby control the system. For example, when a scale of a circuit/system is large, etc., a system control time through the controller 200 cannot be sufficiently secured, to thereby possibly cause a problem.

Consequently, in the embodiment, in addition to an output signal from the comparator CMP1 being transmitted to the controller 200, the isolator 100 is directly stopped.

In an example of FIG. 11, the reference potential GND1 (to 0 V) is connected to the coil L1, which is the transmission-side insulating element, through the switch SW4. The switch SW4 is turned off only when an output of the comparator CMP1 is a high level (Hi), i.e., an insulation deterioration error is output, and a potential level of the transmission-side insulating element is forcibly dropped to a low level (Low). As a result of this, the IGBT 1 returns to an off state, and a high voltage applied state between the insulating elements is released.

As described above, in the embodiment, with respect to the embodiment 2, the switch SW4 is included that controls the potential of the coil according to detection of the leakage current. As a result of this, when the leakage current before a breakdown is detected, it is possible to stop the whole system by the controller 200 after stopping an isolator body in an emergency. Accordingly, the system can be reliably stopped without causing a short circuit between the insulating elements.

Embodiment 6

Hereinafter, an embodiment 6 will be explained with reference to the drawings. The embodiment is an example of converting a leakage current into a voltage using an amplifier instead of a capacitor with respect to the isolator shown in the embodiment 2.

Figure 12:
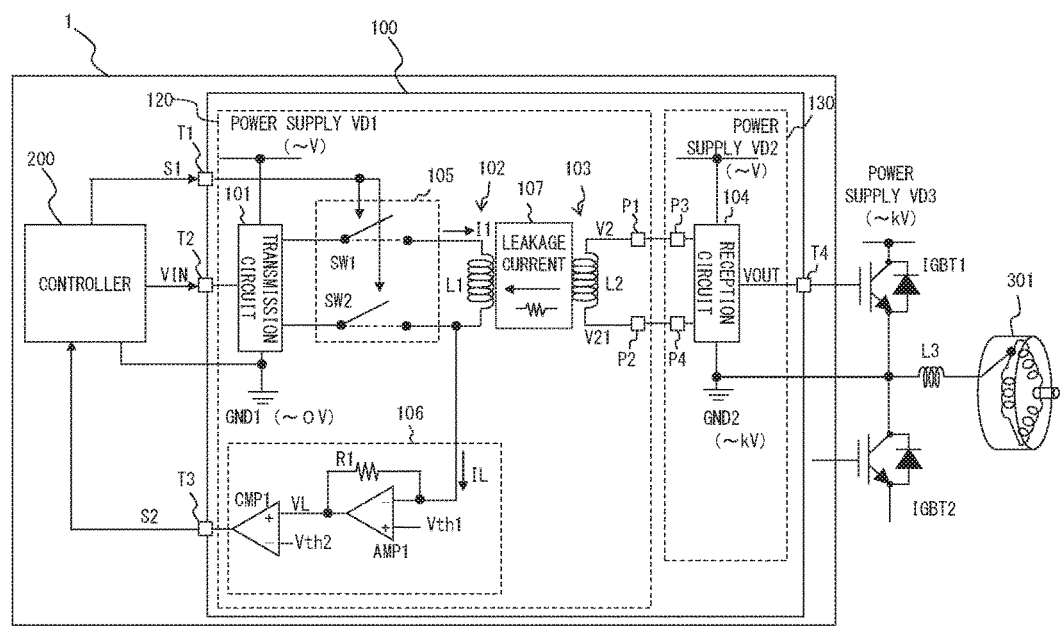
FIG. 12 is a configuration diagram showing a configuration of a control system including an isolator in accordance with an embodiment 6.

FIG. 12 shows a configuration of a motor control system including an isolator in accordance with the embodiment. In FIG. 12, compared with FIG. 2 of the embodiment 2, the leakage current detection unit 106 includes the comparator CMP1 and an amplifier AMP1. Other configurations are similar to those of FIG. 2.

The amplifier AMP1 is a current-voltage conversion amplifier circuit that converts a leakage current into a voltage and amplifies it. In the amplifier AMP1, a positive input terminal is connected to the reference voltage Vth1, a negative input terminal is connected to the other end of the coil L1, and an output terminal is feedback-connected to the negative input terminal through a resistor R1, and is connected to the negative input terminal of the comparator CMP1.

As in the above-described embodiments, a capacity may not be necessarily used for detection of the leakage current. In the embodiment, as shown in FIG. 12, after the leakage current is directly amplified by the amplifier AMP1, the amplified leakage current is input to the comparator CMP1 for error detection. When the leakage current is set as IL, and a feedback resistor is set as R1, a difference voltage ΔVL between the reference voltage Vth1, which is output voltage of the amplifier AMP1, is expressed by the following (Expression 1).

$$\Delta VL = IL * R1 \quad \text{(Expression 1)}$$

It is preferable that the leakage current IL be large enough to obtain the leakage voltage VL according to the leakage current IL by amplification of the amplifier AMP1. Additionally, if a voltage corresponding to a leakage current value without insulating film deterioration is set to the threshold value Vth2 of the comparator CMP1, an error can be detected when an abnormal increase of the leakage current occurs.

As described above, in the embodiment, instead of the capacitor, the amplifier is used as current-voltage conversion means of the leakage current detection unit with respect to the embodiment 2. Even when the amplifier is used, the leakage current, similarly to the above-described embodiments, can be detected. Accordingly, since it becomes possible to generate the error signal according to the leakage current, and to stop the isolator before destruction of the insulating film, reliability of the isolator can be improved.

Embodiment 7

Hereinafter, an embodiment 7 will be explained with reference to the drawings. The embodiment is an example of controlling an operation of all the isolators according to detection results of the plurality of isolators shown in the embodiment 2.

Figure 13:
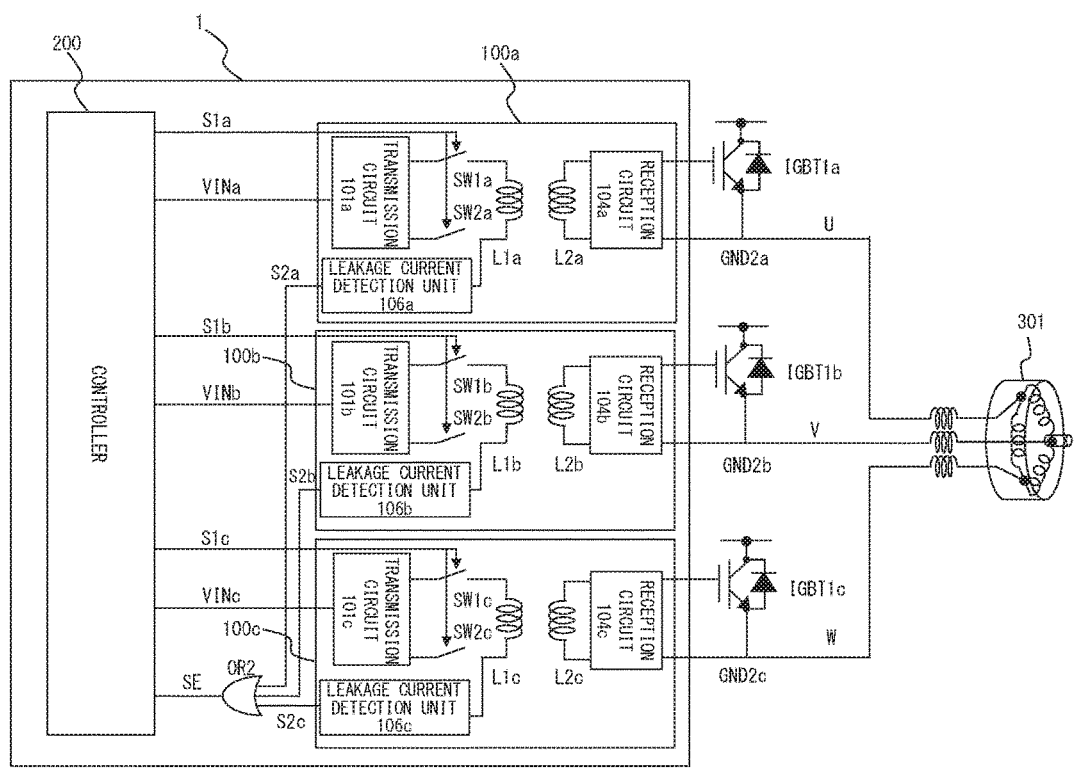
FIG. 13 is a configuration diagram showing a configuration of a control system including isolators in accordance with an embodiment 7.

FIG. 13 shows a configuration of a motor control system including isolators in accordance with the embodiment. As shown in FIG. 13, the semiconductor device 1 includes the controller 200 and a plurality of isolators 100 (100a to 100c), and a plurality of IGBTs (IGBTs 1a to 1c) are connected thereto. Further, the semiconductor device 1 includes a logic circuit OR2 between the controller 200 and the plurality of isolators 100.

In the logic circuit OR2, a plurality of input terminals are connected to the external terminal T3 from which the error signal (an individual error signal) S2 of each isolator 100 is output, and an output terminal is connected to an input terminal of an error signal (a whole error signal) SE of the controller 200. The logic circuit OR2 performs an OR logic operation of inputs from the plurality of isolators, and outputs an operation result. When the error signal S2 of any of the plurality of isolators 100 is a high level, the logic circuit OR2 sets the error signal SE to be a high level, and outputs it to the controller 200.

Figure 14:
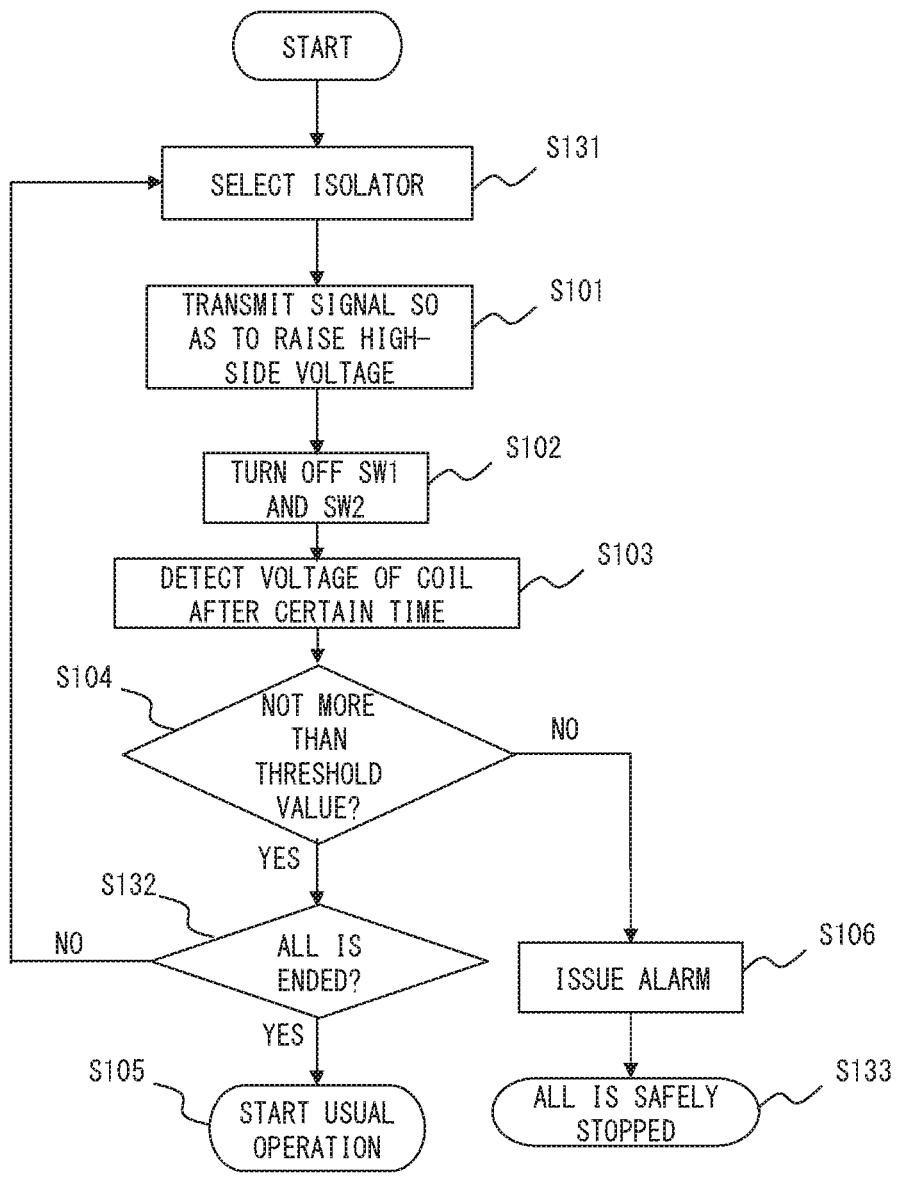
FIG. 14 is a flow chart showing a method for controlling isolators in accordance with the embodiment 7.

FIG. 14 is a flow chart showing a method for controlling the isolator 100 (a test to detect a leakage current or a method for testing insulating film deterioration) in accordance with the embodiment.

As shown in FIG. 14, first, the controller 200 selects the isolator 100 to be tested (S131). For example, the controller 200 selects the isolators 100a to 100c in an order from the isolator 100a. Note that although the isolators are sequentially selected to then perform a test here, the plurality of isolators may be simultaneously tested. In this case, S101 to S104 are simultaneously performed for all the isolators.

Subsequently, similarly to FIG. 5 of the embodiment 2, the controller 200 transmits a signal to the selected isolator 100 so as to raise a high-side voltage (S101), and turns off the switches SW1 and SW2 (S102). Further, the selected isolator 100 detects the leakage voltage VL of the coil L1 after a certain time (S103), and determines whether or not the leakage voltage VL of the coil L1 is not more than the threshold value Vth (S104).

When the leakage voltage VL of the coil L1 of the selected isolator 100 is not more than the threshold value Vth, the controller 200 determines whether or not tests of all the isolators 100 are ended (S132). When testing the remaining isolators, the controller 200 returns to S131 and selects the next isolator 100, and when the tests of all the isolators are ended, the controller 200 starts a usual operation (S105).

When the leakage voltage VL is not more than the threshold value Vth, the comparator CMP1 of the isolator 100 outputs the error signal S2 remaining to be the low level. Since the error signal S2 to be input is the low level, the logic circuit OR2 outputs the error signal SE remaining to be a low level to the controller 200.

Since the error signal SE of the low level is input for a predetermined period, the controller 200 determines the selected isolator 100 to be normal, repeats the test of the next isolator, and starts a usual operation when the tests of all the isolators are normally ended.

In addition, when the leakage voltage VL of the coil L1 of the selected isolator 100 is larger than the threshold value Vth, the controller 200 outputs an alarm (S106), and safely stops all the isolators (S133).

When the leakage voltage VL exceeds the threshold value, the comparator CMP1 of the isolator 100 raises the error signal S2 to the high level. Since the input error signal S2 is the high level, the logic circuit OR2 raises the error signal SE. Since the error signal SE of the high level is input within a predetermined period, the controller 200 determines an insulating film of the selected isolator 100 to be abnormal. In that case, the controller 200 stops operation of all the isolators 100. As a result of this, destruction of the whole system is prevented beforehand.

The isolators for three phases are needed in motor control, and if at least one of them is short-circuited, malfunction and system damage occur. Therefore, in the embodiment, when all the isolators are monitored, and insulating property of any of them deteriorates, operation of all the ICs (isolators) is stopped. As a result of this, reliability of the isolator can be further improved.

Embodiment 8

Hereinafter, an embodiment 8 will be explained with reference to the drawings. The embodiment is an example of including an isolator that detects a leakage current of a reception-side insulating element in addition to the isolator shown in the embodiment 2.

Figure 15:
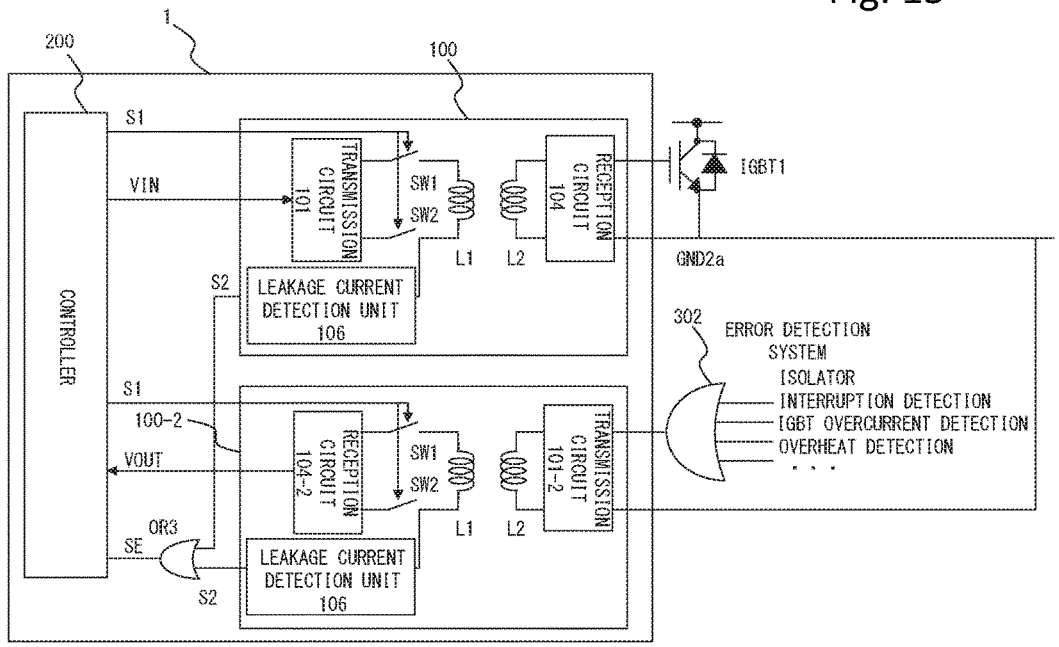
FIG. 15 is a configuration diagram showing a configuration of a control system including isolators in accordance with an embodiment 8.

FIG. 15 shows a configuration of a motor control system including isolators in accordance with the embodiment. As shown in FIG. 15, the semiconductor device 1 includes: the controller 200; the isolator 100; an isolator 100-2; and a logic circuit OR3.

The isolator 100 transmits a signal from the controller 200 to the motor 301. The isolator 100-2 transmits a signal from the motor 301 to the controller 200.

The isolator 100-2 includes a transmission-side chip 120-2 and a reception-side chip 130-2. The transmission-side chip 120-2 includes a transmission circuit 101-2. The reception-side chip 130-2 includes: the insulating element 102; the insulating element 103; a reception circuit 104-2; the impedance control unit 105; and the leakage current detection unit 106.

The transmission data VIN is input to the transmission circuit 101-2 from an error detection circuit 302 through the external terminal T4, and the transmission circuit 101-2 generates an alternating-current transmission signal based on the input transmission data VIN. This alternating-current transmission signal is the signal based on the reference potential GND2 (the second reference potential).

The alternating-current transmission signal is supplied to the insulating element 103 from the transmission circuit 101. The insulating film 107 is formed between the insulating elements 102 and 103. The insulating element 102 is alternating current-coupled to the insulating element 103 through the insulating film 107, and thereby generates an alternating current reception signal. This alternating current reception signal is the signal based on the reference potential GND1 (the first reference potential) different from the reference potential GND.

The alternating current reception signal is input to the reception circuit 104 from the insulating element 102 through the impedance control unit 105. The reception circuit 104 reproduces the reception data VOUT based on the input alternating current reception signal, and outputs the reception data VOUT to the controller 200 through the external terminal T2.

Similarly to the isolator 100, the impedance control signal S1 is input to the impedance control unit 105 from the controller 200 through the external terminal T1, and the impedance control unit 105 controls an impedance of the insulating element 102 to be high based on the input impedance control signal S1. Similarly to the isolator 100, the leakage current detection unit 106 detects a leakage current through the insulating element 102 in which the impedance has been controlled, and outputs the error signal S2, which is a detection result according to the leakage current, to the controller 200 through the external terminal T3.

In the logic circuit OR3, a plurality of input terminals are connected to the external terminal T3 from which the error signal S2 of each isolator is output, and an output terminal is connected to an input terminal of the error signal SE of the controller 200. The logic circuit OR3 performs an OR logic operation of inputs from the plurality of isolators, and outputs an operation result. When the error signal S2 of any of the plurality of isolators 100 is a high level, the logic circuit OR3 sets the error signal SE to be a high level, and outputs it to the controller 200.

In applications, such as control of an in-vehicle motor in which reliability is emphasized, not only a state of an isolator but states of an IGBT and the motor are monitored. For example, as in FIG. 15, the error detection circuit 302 is included that monitors and outputs isolator interruption detection, IGBT overcurrent detection, overheat detection, etc. In the embodiment, another isolator 100-2 is included in order to return a signal of a monitoring result to a primary side. Additionally, a leakage current detection unit is provided at a reception side of the feedback isolator.

As described above, even when the leakage current detection unit is provided at the reception-side, the leakage current, similarly to the above-described embodiments, can be detected. Accordingly, since it becomes possible to generate the error signal according to the leakage current, and to stop the isolator before destruction of the insulating film, reliability of the isolator can be improved.

Hereinbefore, although the invention made by the present inventor has been specifically explained based on the embodiments, the present invention is not limited to the above-described embodiments, and it is needless to say that various changes can be made without departing from the scope of the invention.

Note that the isolator is a circuit that can transmit a signal between circuits having different potentials in a non-contact manner. Signal transmission schemes of the isolator include schemes through a magnetic field (magnetic coupling) by a coil (L), an electric field (capacitive coupling) by a capacitor (C), light by a coupler, an electric wave by an antenna, etc., and any scheme can transmit a signal in the non-contact manner, and can control the potential of the reception circuit side (the secondary side) as in the above-described embodiments. If an isolator having at least insulating elements through an insulating film is employed, the above-described embodiments are applied, thereby a state before destruction of the insulating film is detected, and improvement in reliability can be achieved.

The first to eighth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An electronic device comprising:
   a first insulating element to which an alternating current (AC) transmission signal is supplied;
   a second insulating element which is coupled to the first insulating element and configured to generate an AC reception signal based on the AC transmission signal;
   an insulating film disposed between the first insulating element and the second insulating element; and
   a leakage current detector configured to detect a leakage current of the insulating film.

2. The electronic device according to claim 1, further comprising:
   a transmission circuit configured to generate the AC transmission signal based on an input transmission data from a controller;
   an impedance controller configured to increase an impedance of the first insulating element or the second insulating element; and
   a reception circuit configured to receive the AC reception signal and output reception data to an equipment controlled by the controller through the electronic device.

3. The electronic device according to claim 2, wherein the first insulating element and the second insulating element are inductive elements or capacitive elements.

4. The electronic device according to claim 3, wherein the impedance controller is a switching circuit connected between ends of the inductive elements or the capacitive elements.

5. The electronic device according to claim 2, wherein the impedance controller is a switching circuit connected between the first insulating element and the transmission circuit, or a switching circuit connected between the second insulating element and the reception circuit.

6. The electronic device according to claim 2, wherein the leakage current detector is configured to detect abnormality of the leakage current according to a current that flows for a predetermined period through the first insulating element or the second insulating element in which the impedance has been controlled.

7. The electronic device according to claim 6, wherein the leakage current detector comprises:
   a current-voltage conversion circuit that converts the detected leakage current into a leakage voltage through the first insulating element or the second insulating element in which the impedance has been controlled; and
   a comparison circuit configured to detect abnormality of the leakage current according to a comparison result of the leakage voltage and a predetermined threshold value.

8. The electronic device according to claim 7, wherein the current-voltage conversion circuit is a capacitive element that charges the current that flows for the predetermined period through the first insulating element or the second insulating element in which the impedance has been controlled.

9. The electronic device according to claim 7, further comprising a memory circuit that stores the leakage voltage,
wherein the comparison circuit sets to be the threshold value a leakage voltage stored in the memory circuit when the leakage current detection unit detected the leakage current at a time previous to this time, and compares it with a leakage voltage into which the current-voltage conversion circuit converted a current this time.

10. The electronic device according to claim 9, wherein the threshold value includes the leakage voltage and a voltage margin.

11. The electronic device according to claim 2, further comprising a reference potential supply circuit that according to a detection result of the leakage current, sets to be a first reference potential of the first insulating element in which the impedance has been controlled, or sets to be a second reference potential of the second insulating element in which the impedance has been controlled.

12. The electronic device according to claim 11, wherein the reference potential supply circuit is a switching circuit that according to the detection result of the leakage current, connects one end of the first insulating element and the first reference potential, or connects one end of the second insulating element and the second reference potential.

13. The electronic device according to claim 2, wherein the leakage current detector comprises:
a current-voltage conversion amplifier circuit that converts into a leakage voltage the current that flows through the first or the second insulating element in which the impedance has been controlled, and amplifies it; and
a comparison circuit that detects abnormality of the leakage current according to a result of a comparison of the amplified leakage voltage and a predetermined threshold value.

* * * * *